United States Patent
Maeda et al.

(10) Patent No.: US 8,304,328 B2
(45) Date of Patent: Nov. 6, 2012

(54) MANUFACTURING METHOD OF SEMICONDUCTOR DEVICE AND SUBSTRATE PROCESSING APPARATUS

(75) Inventors: Takahiro Maeda, Toyama (JP); Kiyohiko Maeda, Toyama (JP); Takashi Ozaki, Toyama (JP); Akihito Yoshino, Toyama (JP); Yasunobu Koshi, Toyama (JP); Yuji Urano, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 876 days.

(21) Appl. No.: 12/223,718

(22) PCT Filed: Mar. 15, 2007

(86) PCT No.: PCT/JP2007/055289
§ 371 (c)(1),
(2), (4) Date: Aug. 7, 2008

(87) PCT Pub. No.: WO2007/108401
PCT Pub. Date: Sep. 27, 2007

(65) Prior Publication Data
US 2009/0087964 A1 Apr. 2, 2009

(30) Foreign Application Priority Data
Mar. 20, 2006 (JP) ................. 2006-076572

(51) Int. Cl.
*H01L 21/00* (2006.01)
(52) U.S. Cl. ............. 438/482; 438/758; 257/E21.09
(58) Field of Classification Search ............ 438/478, 438/482, 758, 783, 788, 791; 257/E21.09
See application file for complete search history.

(56) References Cited

U.S. PATENT DOCUMENTS
5,925,188 A 7/1999 Oh
(Continued)

FOREIGN PATENT DOCUMENTS
JP U 2-82031 6/1990
(Continued)

OTHER PUBLICATIONS

Japanese Office Action issued in Application No. 2008-506274; Dated Jan. 25, 2011 (With Translation).

*Primary Examiner* — Jack Chen
(74) *Attorney, Agent, or Firm* — Oliff & Berridge, PLC

(57) ABSTRACT

To realize a high productivity while maintaining excellent film deposition characteristics on a substrate even if a plurality of processing gases of different gas species are used. There are provided the step of loading a plurality of substrates into a processing chamber; supplying a first processing gas to an upper stream side of a gas flow outside of a region where a plurality of substrates loaded into a processing chamber are arranged, supplying a second processing gas to the upper stream side of the gas flow outside of the region where the plurality of substrates loaded into the processing chamber are arranged, supplying the first processing gas to a middle part of the gas flow in the region where the plurality of substrates loaded into the processing chamber are arranged, and causing the first processing gas and the second processing gas to react with each other in the processing chamber, to form an amorphous material and form a thin film on main surfaces of the plurality of substrates; and the step of unloading the substrate after forming the thin film from the processing camber.

26 Claims, 16 Drawing Sheets

U.S. PATENT DOCUMENTS

| | | | |
|---|---|---|---|
| 7,229,502 B2 * | 6/2007 | Wang et al. | 118/715 |
| 2005/0181586 A1 * | 8/2005 | Kurokawa et al. | 438/522 |

FOREIGN PATENT DOCUMENTS

| | | |
|---|---|---|
| JP | A 5-190468 | 7/1993 |
| JP | A 5-251357 | 9/1993 |
| JP | A-07-312364 | 11/1995 |
| JP | A-09-129562 | 5/1997 |
| JP | A 9-129562 | 5/1997 |
| JP | A 2000-68214 | 3/2000 |
| JP | A 2004-95940 | 3/2004 |
| JP | A-2005-123532 | 5/2005 |
| JP | A 2005-286005 | 10/2005 |
| JP | A 2006-186015 | 7/2006 |

* cited by examiner

MANUFACTURING METHOD OF SEMICONDUCTOR DEVICE AND SUBSTRATE PROCESSING APPARATUS

BACKGROUND

1. Technical Field

The present invention relates to a manufacturing method of a semiconductor device and a substrate processing apparatus for processing a plurality of substrates by using a processing gas of different gas species.

2. Background Art

A thermal chemical vapor deposition method (thermal CVD method) is given as an example of a manufacturing method of a semiconductor device. By this thermal CVD method, two kinds or more of processing gases of different gas species are used to form a thin film on a substrate such as a wafer. Particularly, when a plurality of substrates are collectively processed, the processing gases of different species are supplied into a processing chamber heated to a film forming temperature, and thin films are simultaneously formed on the plurality of substrates. When a nitride silicon film is formed as the thin film, the processing gas containing silicon (Si) and the processing gas containing nitrogen (N) are thermally decomposed to precipitate nitride silicon on the substrate (for example, see patent document 1).

FIG. 4 is a schematic block diagram showing an example of a processing furnace of a substrate processing apparatus for simultaneously forming the thin film on the plurality of substrates. This substrate processing apparatus is constituted of, for example, a vertical pressure reducing CVD device. This processing furnace 5 includes a heater 3 and a reaction tube 4. A boat 8, on which a plurality of wafers 9 are stacked, is loaded into a processing chamber 2 formed in the reaction tube 4. A gas supply system 1 for supplying the processing gas of different gas species or inert gas into the processing chamber and an exhaust system 7 having a pump 6 for exhausting an inside of the processing chamber 2 are provided in a processing furnace 5.

It is general to use one system nozzle in which every one nozzle is provided for each processing gas. In this one system nozzle, every one nozzle for deposition processing is provided for each processing gas. The one system nozzle is provided on an upper stream side (lower part of the processing chamber 2) of a gas flow outside of a region in which a plurality of wafers 9 exist. Accordingly, each processing gas is supplied from each one place in the lower part of the processing chamber 2, toward the plurality of wafers 9 stacked on the boat 8.

Patent document 1: Japanese Patent Laid Open No. 2004-95940

Here, when there is a small number of substrates to be processed, or when the substrate to be processed is a small diameter substrate, the thin film having an excellent deposition characteristics can be formed on the substrate by using the aforementioned substrate processing apparatus. This because, a surface area of the substrate on which the thin film is formed is small, and therefore a flow rate of the processing gas required for deposition, namely, the flow rate of the processing gas required for covering a substrate surface area can be covered by using the aforementioned processing furnace even under a reduced pressure.

However, when there is a large number of substrates to be processed, or when the substrate to be processed is a large diameter substrate having a high pattern density, the surface area in which the thin film is formed is increased. In this case, in the aforementioned substrate processing apparatus, the processing gas of a specific amount or more of flow rate needs to be supplied into the processing chamber from one place. However, there is an exhaust resistance in the processing chamber, and therefore when the processing gas of a specific amount or more flow rate is supplied from one place, the pressure in the processing chamber is increased, thus making it difficult to reduce the pressure of the processing chamber to deposit a film.

Therefore, when the film is deposited by reducing the pressure in the processing chamber, the flow rate of the processing gas needs to be restricted to a specific amount or less of flow rate. However, the processing gas is gradually consumed for depositing the film, toward a stacking direction in which a plurality of substrates are stacked (from an upper stream side to a lower stream side). Therefore, when the flow rate of the processing gas is restricted to a specific amount or less, an amount of the processing gas supplied to the substrate that exists on the lower stream side of the gas flow out of the plurality of substrates becomes gradually insufficient. Accordingly, when the thin film formed from an amorphous material obtained by chemical reaction by using two kinds or more of different gas species, particularly, the deposition characteristics such as a practical film thickness uniformity can hardly maintained. Note that in order to suppress an increase of the surface area of the substrate on which the thin film is formed, it can be considered that the number of wafers is made small. However, in this case, the number of wafers that can be collectively processed is also reduced, thus deteriorating productivity of the substrate processing apparatus itself. Namely, when the plurality of substrates are processed by using the processing gas of different gas species, the following phenomenon occurs. Namely, the productivity is lowered when the deposition characteristics is prioritized, and when the productivity is prioritized, the deposition characteristics are deteriorated. Particularly, when the thin film of a large diameter having a high pattern density is deposited, this tendency becomes remarkable.

An object of the present invention is to provide the manufacturing method and the substrate processing apparatus capable of realizing a high productivity, while maintaining excellent deposition characteristics in a case of using the processing gas of different gas species.

SUMMARY OF THE INVENTION

According to one aspect of the present invention, there is provided a manufacturing method of a semiconductor device, including the steps of:

loading a plurality of substrates into a processing chamber;

supplying a first processing gas containing at least one element out of a plurality of elements constituting a thin film formed on a main surface of the substrate and capable of depositing a film by itself singularly, to an upper stream side of a gas flow outside of a region in which the plurality of substrates loaded into the processing chamber are arranged, and supplying a second processing gas containing at least other element out of the plurality of elements and not capable of depositing the film by itself singularly, to the upper stream side of the gas flow outside of the region in which the plurality of substrates loaded into the processing chamber are arranged, and supplying the first processing gas to a middle portion of the gas flow in the region where the plurality of substrates loaded into the processing chamber are arranged, and forming an amorphous material by causing reaction between the first processing gas and the second processing gas in the processing chamber, and forming the thin film on the main surfaces of the plurality of substrates; and unloading the substrate already formed with the thin film form the processing chamber.

According to the present invention, high productivity can be realized while maintaining excellent film deposition characteristics in a case of using the processing gas of different gas species.

DESCRIPTION OF PREFERRED
EMBODIMENTS OF THE INVENTION

Preferred embodiments of the present invention will be explained hereunder, based on the drawings.

As described above, in a conventional substrate processing apparatus such as a vertical type pressure reducing CVD device, when each processing gas of different gas species is supplied only from one place, it is difficult to uniformly supply each processing gas to an entire body of a wafer arrangement area, and accordingly it is difficult to make the thickness of a film uniform between plural wafers and in a surface of the wafer (here, the wafer arrangement area refers to an area where a plurality of wafers are arranged). Therefore, in this embodiment, the vertical type pressure reducing CVD device is set as a multi-system nozzle type CVD device. This multi system nozzle type CVD device is a device in which a plurality of nozzles for film deposition processing are provided for one or a plurality of processing gases, so as to be positioned at different positions.

(1) First Embodiment

In the multi system nozzle type CVD device of this embodiment, not only the nozzle for supplying one gas species is set as the multi system nozzle, but also the nozzle for supplying other gas species is set as the multi system nozzle.

(1-1) Structure

FIG. 1 is a detailed view of a gas supply system connected to a processing furnace 202 constituting a part of a substrate processing apparatus according to a first embodiment of the present invention. FIG. 3 is a view showing a structure of a first embodiment of the present invention, and is a schematic block diagram of the processing furnace 202 of the substrate processing apparatus. Note that both processing furnaces 202 of FIG. 1 and FIG. 3 are shown as a vertical sectional view.

(1) Constitutional Elements of a Device and a Function of Each Constitutional Element The device shown in FIG. 3 has the processing furnace 202, a gas supply system 232, and an exhaust system 232. Here, the processing furnace 202 is a system for forming a prescribed thin film on a surface of a wafer 200, being a semiconductor device, by using a processing gas in an air-tightly closed processing chamber 201. Also, the gas supply system 232 is a system for supplying the processing gas, a cleaning gas, and an inert gas, etc, into the processing chamber 201 of this processing furnace 202. Further, the exhaust system 231 is a system for exhausting an atmosphere in the processing chamber 201.

(2) The Constitutional Element of the Processing Furnace 202 and the Function of Each Constitutional Element As shown in FIG. 3, the processing furnace 202 has a heater 206 as a heating mechanism. The heater 206 has a cylindrical shape, and is vertically installed by being supported by a heater base 251 as a holding board.

A process tube 203 as a reaction tube is arranged concentrically with the heater 206. The process tube 203 has an inner tube 204 and an outer tube 205 as an external reaction tube provided outside of the inner tube 204. The inner tube 204 is composed of a heat resistant material such as quartz ($SiO_2$) or silicon carbide (SiC), and is formed in a cylindrical shape, with an upper end and a lower end opened. The processing chamber 201 is formed in a cylindrical hollow part of the inner tube 204. In the processing chamber 201, a boat 217 as a substrate holding tool as will be described later is constituted so as to house wafers. The boat 217 is constituted so as to house wafers 200, being substrates, in a state of being arranged in multiple stages in a vertical direction in a horizontal posture. The outer tube 205 is made of a heat resistant material such as quartz or silicon carbide, with an inner diameter made larger than an outer diameter of the inner tube 204, in a cylindrical shape with the upper end closed and the lower end opened, and is provided concentrically with the inner tube 204.

A manifold 209 is disposed in a lower part of the outer tube 205 concentrically with the outer tube 205. The manifold 209 is made of, for example, a metal member such as stainless, and is formed in a cylindrical shape with the upper end and the lower end opened. The manifold 209 is engaged with the inner tube 204 and the outer tube 205, respectively, so as to support them respectively. In addition, an O-ring 220a is provided between the manifold 209 and the outer tube 205, as a sealing member. By supporting the manifold 209 by the heater base 251, the process tube 203 is set in a state of being installed vertically. A reaction vessel is formed by the process tube 203 and the manifold 209.

The gas supply system 232 for supplying the processing gas into the processing chamber 201 is connected to a side wall of the manifold 209 so as to communicate with an inside of the processing chamber 201. A nozzle 230, being a gas introduction part, is connected to the gas supply system 232. A processing gas supply source and an inert gas supply source not shown are connected to the upper stream side of the gas supply system 232, namely, to the opposite side to a connection side with the nozzle 230 of the gas supply system 232, via a mass flow controller (MFC) 241, being a gas flow controller. A gas flow controller 235 is electrically connected to the MFC 241. The MFC 241 is constituted so as to control a gas flow rate at a desired timing, so that the gas flow rate supplied into the processing chamber 201 reaches a desired amount. Note that a detailed structure of the gas supply system 232 will be described later.

In addition, the exhaust system 231 for exhausting the atmosphere in the processing chamber 201 is provided on a side wall of the manifold 209. The exhaust system 231 is arranged in a lower end part of a cylindrical space 250 formed by a gap between the inner tube 204 and the outer tube 205, and is communicated with the inside of the cylindrical space 250. A vacuum exhaust device 246 such as a vacuum pump is connected to the lower stream side of the exhaust system 231, namely to the opposite side to the connection side with the manifold 209 of the exhaust system 231, via a pressure sensor 245 and a main valve 242 as a pressure detector. The main valve 242 has a function of blocking a space between the processing chamber 201 and the vacuum exhaust device 246, and also is capable of freely changing an opening degree so that the pressure in the processing chamber 201 reaches a prescribed pressure (vacuum degree). A pressure controller 236 is electrically connected to the main valve 242 and the pressure sensor 245. The pressure controller 236 is constituted to feedback-control the opening degree of the main valve 242, based on the pressure in the processing chamber 201 and in the exhaust system 231 detected by the pressure sensor 245, so that the pressure in the processing chamber 201 reaches a desired pressure at a desired timing. Note that an excessive pressurization preventing line 233 is connected to the upper stream side of the main valve 242 of the exhaust system 231, for performing excessive pressurization preventing processing. An excessive pressurization preventing valve 234 is inserted into the excessive pressurization preventing line 233. When the pressure in the processing chamber 201 becomes excessive pressurization and such an excessive pressurization is detected by the pressure sensor 245, the excessive pressurization preventing valve 234 is opened by the pressure controller 236, and an excessive pressurization state in the processing chamber 201 is opened.

A seal cap 219, being a throat lid member, is provided in a lower part of the manifold 209, so as to air-tightly close a lower end opening of the manifold 209. The seal cap 219 is abutted on the lower end of the manifold 209 from a vertically lower side. The seal cap 219 is, for example, made of metal such as stainless, and is formed in a disc shape. An O-ring 220b, being a sealing member that abuts on the lower end of the manifold 209 is provided on an upper surface of the seal cap 219. A rotation mechanism 254 for rotating the boat 217 is installed on the opposite side of the processing chamber 201 of the seal cap 219. A rotary shaft 255 of the rotation mechanism 254 is penetrated through the seal cap 219 and is connected to the boat 217 as will be described later. By rotating the boat 217 by means of the rotation mechanism 254, the wafer 200 is rotated. The seal cap 219 is vertically elevated by a boat elevator 115, being an elevation mechanism installed vertically in an outside part of the process tube 203. Thus, the boat 217 can be loaded and unloaded in/from the processing chamber 201. A drive controller 237 is electrically connected to the rotation mechanism 254 and the boat elevator 115. The drive controller 237 controls the rotation mechanism 254 and the boat elevator 115, so that the rotation mechanism 254 and the boat elevator 115 perform a desired operation at a desired timing.

The boat 217 is made of a heat resistant material such as quartz ($SiO_2$) or silicon carbide (SiC), so that a plurality of wafers 200 are held therein in multiple stages in a horizontal posture, with centers thereof mutually aligned. In addition, a plurality of heat insulating boards 216, being heat insulating members, having a disc shape made of the heat resistant material such as quartz and silicon carbide, are arranged in multiple stages in the horizontal posture. By the heat insulating boards 216, heat from the heater 206 is hardly transmitted to the manifold 209 side.

In this embodiment, a wafer arrangement region R is composed of three regions. They are, for example, a side dummy wafer arrangement region $R_2$, a product wafer/monitor wafer arrangement region $R_1$, and a side dummy wafer arrangement region $R_0$, from the top (lower stream side of a gas flow) as shown in FIG. 1.

A temperature sensor 263, being a temperature detector, is installed in the process tube 204. A temperature controller 238 is electrically connected to the heater 206 and the temperature sensor 263. Based on temperature information detected by the temperature sensor 263, the temperature controller 238 controls a power supply condition to the heater 206, so that the temperature in the processing chamber 201 has a desired temperature distribution at a desired timing. Specifically, the temperature controller 238 controls the heater 206, so that a main surface temperature of a plurality of wafers 200 loaded into the processing chamber 201 is increased to a temperature at which the processing gas is thermally decomposed. Also, the temperature controller 238 controls the heater 206, so that the main surface temperature of the plurality of wafers 200 is made substantially uniform over an entire body of a region where the plurality of wafers 200 are arranged. Here, although a substantially uniform temperature has preferably a temperature gradient set at completely 0, there is also a case such as a slight temperature gradient, for example, the temperature gradient of about 0 to ±10° C.

The gas flow controller 235, the pressure controller 236, the drive controller 237, and the temperature controller 238 also constitute an operation part and an input/output part, and is electrically connected to a main controller 239 that controls an entire body of the substrate processing apparatus. These gas flow controller 235, pressure controller 236, drive controller 237, temperature controller 238, and main controller 239 are constituted as a controller 240.

(3) Constituent Elements of the Gas Supply System 232 and the Function of Each Constituent Element As shown in FIG. 1, the gas supply system 232 has nozzles 41 to 44 as first gas supply nozzles, a nozzle 45, nozzles 46 to 49 as second gas supply nozzles, nozzles 50 to 51, piping parts 61 to 109, air valves 121 to 160, MFCs 171 to 184, and a controller 240.

Here, the nozzles 41 to 44 and the nozzle 45 are shared in film deposition processing, after purging processing, cleaning processing, and atmospheric pressure returning processing. Also, nozzles 46 to 49 and a nozzle 50 are nozzles shared in after purge processing and the atmospheric pressure returning processing. Further, a nozzle 51 is a nozzle shared in cleaning gas processing and the atmospheric pressure returning processing. These nozzles 41 to 51 are constituted of quartz, for example. Here, the after purge processing is the processing for cleaning the nozzles 41 to 51 and the processing chamber 201 by inert gas, after the film deposition processing is finished. The cleaning processing is the processing for cleaning a reaction product deposited on the process tube 203 and the nozzles 41 to 50. The atmospheric pressure returning processing is the processing for making the pressure in the processing chamber 201 return to the atmospheric pressure after the after purge processing is finished.

The piping parts 61 to 109 are the piping for supplying each kind of gases to the nozzles 41 to 51. The air valves 121 to 160 are valves for opening/closing each of the piping parts 61 to 109. The MFCs 171 to 184 are controller that controls each flow rate per unit time, flowing through piping parts 62 to 66, 68 to 69, 76 to 80, 82, 88 of the gas supplied into piping parts 62 to 66, 68 to 69, 76 to 80, 82, 88. The controller 240 controls open/close of the air valves 121 to 160 via the gas flow controller 235 and each operation of the MFCs 171 to 184.

In addition, the air valves 121 to 125, and the air valves 132 to 136 have the function of selectively supplying to piping parts 89 to 93 the processing gas flowing through the piping parts 62 to 66 or the inert gas flowing through the piping parts 70 to 74. Further, the air valves 151 to 155 and the air valves 156 to 160 have the function of selectively supplying into the piping parts 105 to 109 the cleaning gas flowing through the piping parts 83 to 87 or gas (the processing gas or the inert gas) flowing through the piping parts 89 to 93.

In addition, the air valves 142 to 146 and the air valves 127 to 131 have the function of selectively supplying into piping parts 94 to 98 the processing gas flowing through the piping parts 76 to 80 or the inert gas flowing through the piping parts 99 to 103.

(4) Arrangement Structure of the Nozzles 41 to 51

The aforementioned nozzles 41 to 44, being first gas supply nozzles, are constituted as L-like tubular shapes, and are raised in a vertical direction (an arrangement direction of the substrates) along an inner wall of the processing chamber 201. Base end portions of the nozzles 41 to 44 are positioned to the outside of the side wall of the manifold 209 via a nozzle through hole formed on the side wall of the manifold 209. In addition, tip end portions of the nozzles 41 to 44 are positioned to middle parts of the gas flow in a region where a plurality of wafers 200 loaded into the processing chamber 201 are arranged. Specifically, the tip end portion of each nozzles 41 to 44 is respectively positioned to plural middle parts of mutual different positions (heights) provided along the gas flow. For example, each tip end portion of the nozzles 41 to 44 is respectively positioned to 76-th, approximately $51^{st}$, approximately 26-th, and approximately first, counted from approximately the lower part of 100-th wafer, for example, (an upper stream side of the gas flow) that exits in a product wafer/monitor wafer arrangement region $R_1$.

In addition, similarly to the nozzles 41 to 44, the aforementioned nozzles 46 to 49, being second gas supply nozzles, are also constituted as the L-like tubular shapes, and are raised (extended) in the vertical direction (arrangement direction of the substrates) along the inner wall of the processing chamber 201. The base end portions of the nozzles 46 to 49 are positioned to the outside of the side wall of the manifold 209, via the nozzle through hole formed on the side wall of the manifold 209. In addition, the tip end portions of the nozzles 46 to 49 are positioned in the middle parts of the gas flow in the region where the plurality of wafers 200 are arranged, substantially at the same position (height) as that of the tip end portions of the nozzles 41 to 44. For example, similarly to each tip end portion of the nozzles 41 to 44, each tip end portion of the nozzles 46 to 49 is positioned to approximately 76-th, approximately $51^{st}$, approximately 26-th, and approximately first of 100 wafers, for example, that exist in the product/monitor wafer arrangement region $R_1$.

In addition, the aforementioned nozzles 45 and 50 are constituted as straight tubular shapes, and are provided in a horizontal direction in the processing chamber 201, and are not raised (extended) in the vertical direction. The base end portions of the nozzles 45 and 50 are positioned to the outside of the side wall of the manifold 209, via the nozzle through hole formed on the side wall of the manifold 209. Further, the tip end portions of the nozzles 45 and 50 are positioned on the upper stream side of the gas flow outside of the wafer arrangement region R. Namely, the tip end portions of the nozzles 45 and 50 are positioned in a lower part outside of the wafer arrangement region R. Note that the shapes of the nozzles 45 and 50 are not limited to the aforementioned shape, but may be constituted as the L-like tubular shape and may be raised (extended) in the vertical direction.

In addition, the aforementioned nozzle 51 is constituted as the L-like tubular shape, and is raised in the vertical direction along the inner wall of the processing chamber 201. The base end portion of the nozzle 51 is positioned to the outside of the side wall of the manifold 209, via the nozzle through hole formed on the side wall of the manifold 209. Further, the tip end portion of the nozzle 51 is positioned to the upper stream side of the gas flow outside of the wafer arrangement region R. Namely, the tip end portion of the nozzle 51 is positioned in the lower part outside of the wafer arrangement region R.

With the aforementioned structure, the gas flow in the nozzles 41 to 44 and 46 to 49 is made longer than the gas flow in the nozzles 45, 50, 51.

Note that as shown in a connection structure of a piping part as will be described later, the first processing gas can be supplied from the nozzles 41 to 45, respectively. In addition, the second processing gas, being the gas species different from that of the first processing gas, is supplied from the nozzles 46 to 50, respectively. In addition, in addition to the processing gas, the inert gas is supplied form the tip end portions of the nozzles 41 to 50, respectively. Further, in addition to the processing gas and the inert gas, cleaning gas for gas cleaning can be supplied from the tip end portions of the nozzles 41 to 45, respectively. Note that in addition to the cleaning gas, the inert gas can be supplied into the processing chamber 201 from the tip end portion of the nozzle 51.

(5) Connection Structure of Piping Parts 61 to 109

An upper stream side end portion of the piping part 61 is connected to an accumulation source (not shown) of the first processing gas, and a lower stream side end portion is connected to the upper stream side end portion of the piping parts 62 to 66. The lower streams side end portions of these piping parts 62 to 66 are connected to the upper stream side end portions of piping parts 89 to 93, respectively. The lower stream side end portions of these piping parts 89 to 93 are connected to the upper stream side end portions of piping parts 105 to 109, respectively. The lower stream side end portions of these piping parts 105 to 109 are connected to the base end portions (gas input ports) of the nozzles 41 to 45.

The upper stream side end portion of the piping part 75 is connected to the accumulation source (not shown) of the second processing gas, and the lower stream side end portion thereof is connected to the upper stream side end portion of the piping parts 76 to 80. The lower stream side end portions of these piping parts 76 to 80 are connected to the upper stream side end portions of the piping parts 94 to 98, respectively. The lower stream side end portions of these piping parts 94 to 98 are connected the base end portions of the nozzles 46 to 50.

The upper stream side end portion of the piping part 81 is connected to the accumulation source (not shown) of the cleaning gas, and the lower stream side end portion thereof is connected to the upper stream side end portions of the piping parts 82 and 88. The lower stream side end portion of the piping part 82 is connected to the upper stream side end portions of the piping parts 83 to 87. The lower stream side end portions of these piping parts 83 to 87 are connected to the upper stream side end portions of piping parts 105 to 109, respectively. The lower stream side end portion of the piping part 88 is connected to the base end portion of the nozzle 51. Note that the upper stream side end portion of the piping part 88 is also connected to the lower stream side end portion of the piping part 104. The upper stream side end portion of the piping part 104 is connected to the lower stream side end portion of the piping part 68.

The upper stream side end portion of the piping part 67 is connected to the accumulation part (not shown) of the inert gas, and the lower stream side end portion thereof is connected to the upper stream side end portions of the piping parts 68 and 69. The lower stream side end portion of the piping part 68 is connected to the upper stream side end portions of the piping parts 99 to 103. The lower stream side end portions of these piping parts 99 to 103 are connected to the upper stream side end portions of the piping parts 94 to 98. The lower stream side end portion of the piping part 69 is connected to the upper stream side end portion of the piping parts 70 to 74. The lower stream side end portions of these piping parts 70 to 74 are connected to the upper stream side end portions of the piping parts 89 to 93.

In the above description, the first processing gas includes at least one element out of a plurality of elements constituting the thin film formed on the main surface of the wafer 200, and the gas capable of depositing the film by itself singularly is used. In addition, the second processing gas includes at least other one element out of the plurality of elements constituting the thin film formed on the main surface of the wafer 200, and the gas not capable of depositing the film by itself singularly. For example, when a nitride silicon film ($Si_3N_4$ film) is formed on the main surface of the wafer 200, DCS (dichlorosilane; $SiH_2Cl_2$), for example, is used as the first processing gas, and $NH_3$ (ammonia) gas is used as the second processing gas, or $CH_3$—NH—$NH_2$(monomethylhydrazine) gas and $(CH_3)_2$—N—NH 2(dimethylhydrazine) gas, etc, is used as an organic ammonia gas. Namely, for example NH3-based gas is used as the second processing gas. In addition, for example, $N_2$ (nitrogen) gas is used as the inert gas, and for example $NF_3$ (nitrogen trifluoride) gas is used as the cleaning gas. In addition, when a high temperature oxide film ($SiO_2$ film) is formed, for example, the DCS (dichlorosilane; $SiH_2Cl_2$) gas or $SiH_4$ (silane) gas is used as the first processing gas, and for example, nitrogen oxide gas such as $N_2O$ (nitrogen dioxide) or NO (nitrogen oxide) gas is used as the second processing gas. Note that a case of forming the $Si_3N_4$ film on the wafer 200 by using the DCS gas as the first processing gas and by using the $NH_3$ gas as the second processing gas, will be explained over an entire body of this specification, as a typical example.

(6) Insertion Structure of Air Valves 121 to 160 and MFCS 171 TO 184

The air valves 121 to 125 and the MFCs 171 to 175 are respectively inserted into the piping parts 62 to 66. In this case, the MFCs 171 to 175 are inserted to the upper stream side of the air valves 121 to 125, respectively. The air valves 132 to 136 are inserted into the piping parts 70 to 74, respectively. The air valves 151 to 155 are respectively inserted into the piping parts 83 to 87. The air valves 156 to 160 are respectively inserted into the piping parts 89 to 93.

The air valves 137 to 141, the MFCs 178 to 182, and the air valves 142 to 146 are respectively inserted into the piping parts 76 to 80. In this case, MFCs 178 to 182 are inserted between air valves 137 and 142, air valves 138 and 143, air valves 139 and 144, air valves 140 and 145, and air valves 141 and 146, respectively. The air valves 127 to 131 are inserted into piping parts 99 to 103.

The air valve 148 and the MFC 177 are inserted into the piping part 69. In this case, the MFC 177 is inserted to the lower stream side of the air valve 148. The air valve 126 and the MFC 176 are inserted into the piping part 68. In this case, the MFC 176 is inserted to the lower stream side of the air valve 126.

The air valve 147 and the MFC 183 are inserted into the piping part 82. In this case, the MFC 183 is inserted into the lower stream side of the air valve 147. The air valves 149, 150 and the MFC 184 are inserted into the piping part 88. In this case, the MFC 184 is inserted between the air valves 149 and 150.

(7) Relation Between the Present Invention and the First Embodiment

In the above-describe structure, the nozzle 45, the piping part 109, the valve 160, the piping part 93, the valve 125, the piping part 66, the MFC 175, and the piping part 61 correspond to "the first gas supply part for supplying the first processing gas to the upper stream side of the gas flow outside of the region where a plurality of substrates are arranged" of the present invention. In addition, the nozzles 41 to 44, the piping parts 105 to 108, the valves 156 to 159, the piping parts 89 to 92, the piping parts 62 to 65, the air valves 121 to 124, the MFCs 171 to 174, and the piping part 61 correspond to "the second gas supply part for supplying the first processing gas to the middle parts of the gas flow in the region where a plurality of substrates are arranged" of the present invention. In addition, the nozzle 50, the piping part 98, the valve 146, the MFC 182, the valve 141, the piping part 80, and the piping part 75 correspond to "third gas supply part for supplying the second processing gas to the upper stream side of the gas flow outside of the region where a plurality of substrates are arranged" of the present invention. Also, the nozzles 46 to 49, the piping parts 94 to 97, the piping parts 76 to 79, the valves 142 to 145, the MFCs 178 to 181, the valves 137 to 140, and the piping part 75 correspond to "the fourth gas supply part for supplying the second processing gas to the middle parts of the gas flow in the region where a plurality of substrates are arranged" of the present invention. Also, an exhaust system 33 corresponds to the "exhaust part" of the present invention. Further, the product wafer/monitor wafer arrangement region $R_1$ corresponds to "the region where a plurality of substrates are arranged" of the present invention.

(1-2) Operation

Subsequently, explanation will be given for a method of forming the thin film on the wafer 200 by the CVD method, as one step of the manufacturing steps of the semiconductor device. This method is executed by the substrate processing apparatus having the aforementioned processing furnace 202. Note that in the explanation given hereunder, the operation of each part constituting the substrate processing apparatus is controlled by the controller 240.

(1) Overall Operation

First, explanation will be given for an overall operation of a case when a prescribed thin film is formed on the surface of the wafer 200.

First, a plurality of wafers 200 are charged (wafer charge) into the boat 217 unloaded from the inside of the process tube 203. Thus, a plurality of, for example, 100 wafers 200, with its diameter set at 300 mm, are housed in the boat 217, for forming the thin film. When the wafer charge is finished, the boat 217, having the plurality of wafers 200 held therein, is lifted by the boat elevator 115, and as shown in FIG. 3, which is then loaded into the processing chamber 201 (boat loading) (the step of loading the substrate into the processing chamber). In this state, the lower end of the manifold 209 is set in a sealed state via the O-ring 220b.

When this boat load processing is finished, the inside of the processing chamber 201 is vacuum-exhausted by the vacuum exhaust device 246 so that the pressure in the processing chamber 201 reaches a desired pressure (vacuum degree). Thus, the atmosphere in the processing chamber 201 is discharged via the exhaust system 231. At this time, the pressure in the processing chamber 201 is measured by the pressure sensor 245. Based on this measured pressure, an opening degree of the main valve 242 is feedback-controlled. In addition, the inside of the processing chamber 201 is heated by the heater 206 so as to be a desired temperature. Then, based on temperature information detected by the temperature sensor 263, the power supply condition to the heater 206 is feedback-controlled, so as to have a desired temperature distribution. Specifically, the power supply condition to the heater 206 is controlled, so that a main surface temperature of the plurality of wafers 200 loaded into the processing chamber 201 is increased up to the temperature at which at least both of the first processing gas and the second processing gas are thermally decomposed, and the main surface temperature of the plurality of wafers 200 are made substantially uniform over the entire body of the region where the plurality of wafers are arranged. Subsequently, by means of the rotation mechanism 254, the wafer 200 is rotated by rotation of the boat 217.

When the vacuum exhaust processing is finished, the film deposition processing is executed. Namely, the gas supplied from a supply source of the processing gas and controlled to be a desired flow rate by the MFC 241, is introduced into the processing chamber 201 from the nozzle 230 through the gas supply system 232. The introduced gas is drifted upward in the processing chamber 201, is flown into the cylindrical space 250 form the upper end opening of the inner tube 204, and is exhausted from the exhaust system 231. The processing gas is brought into contact with the surface of the wafer 200 when passing through the inside of the processing chamber 201, and at this time, the thin film is deposited on the surface of the wafer 200 by thermal CVD reaction. Note that details of the film deposition will be described later.

When this film deposition processing is finished, after-purge processing is executed. Namely, the inert gas is supplied into the processing chamber 201 form a gas output port (tip end portion) of the gas supply system 232. In addition, at this time, the vacuum exhaust processing is executed by the vacuum exhaust device 246. As a result, the atmosphere in the processing chamber 201 is cleaned by the inert gas.

When this after-purge processing is finished, the atmospheric pressure returning processing is executed. Namely, the vacuum exhaust processing is stopped, and only supply processing of the inert gas is executed. As a result, the pressure in the processing chamber 201 is returned to a normal pressure.

When this atmospheric pressure processing is finished, boat unloading processing is executed. Namely, the seal cap 219 is lowered by the boat elevator 115, then the lower end of the manifold 209 is opened, and an already film deposited wafer 200 is unloaded (boat unloading) to the outside of the process tube 203 form the lower end of the manifold 209 in a state of being held by the boat 217 (the step of unloading the substrate from the processing chamber). Thereafter, the already film deposited wafer 200 is recovered by the boat 217 (wafer discharge), and the processing of the first batch is finished. Similarly, regarding the second batch and thereafter, the aforementioned processing is executed to the next plural wafers 200.

(2) Operation for Cleaning the Inner Wall, Etc, of the Process Tube 203

Next, explanation will be given for the operation for cleaning the inside, etc, of the process tube 203.

In this case, the cleaning gas is supplied into the processing chamber 201 from a gas output port (tip end portion) of the nozzle 51. Thus, the reaction product deposited on the inner wall of the process tube 203 and outer walls of the nozzles 41 to 51 are etched. In addition, at this time, the vacuum exhaust processing is executed by the vacuum exhaust device 246. Thus, the etched reaction product is discharged to the outside of the processing chamber 201 via the exhaust system 231.

(3) Operation for Cleaning the Inner Wall of the Nozzles 41 to 45

Next, the operation for cleaning the inner wall of the nozzles 41 to 45 will be explained.

In this embodiment, this cleaning processing is simultaneously performed as the cleaning processing of the inner wall of the process tube 203. In this case, the cleaning gas is supplied from the piping parts 83 to 87 to the gas input port (base end portion) of the nozzles 41 to 45 for film deposition processing. Thus, the reaction product deposited on the inner wall of the nozzles 41 to 45 is etched by the cleaning gas. In addition, at this time, the vacuum exhaust processing is executed by the vacuum exhaust device 246. Thus, the etched reaction product is outputted (discharged) into the processing chamber 201 form the gas output ports (tip end portions) of the nozzles 41 to 45. Then, the reaction product outputted (discharged) into the processing chamber 201 is discharged to the outside of the processing chamber 201 via the exhaust system 231.

Note that this cleaning processing is performed one by one, by sequentially selecting five nozzles 41 to 45 one by one according to a previously defined order. In this case, the inert gas is supplied to four selected nozzles from four piping parts 70 to 74. In addition, at this time, the inert gas is supplied to five nozzles 46 to 50 from the piping parts 94 to 98. Thus, over-etching of the nozzles is prevented.

Namely, usually the cleaning gas is remained inside of the nozzle that has undergone the cleaning processing. Accordingly, when such a state is left as it is, the entire body of the inner wall of the nozzle is over-etched. However, in this embodiment, the inert gas is supplied to the nozzle that has undergone the cleaning processing. Thus, the cleaning gas remained inside of this nozzle is sent out. As a result, the over-etching due to residual cleaning gas is prevented.

In addition, in this embodiment, the cleaning processing of the inner wall of the nozzles 41 to 45 is performed simultaneously with the cleaning processing of the inner wall of the process tube 203. At this time, when the inert gas is not supplied to the nozzle that has not undergone the cleaning processing, the cleaning gas supplied into the processing chamber 201 by the nozzle 51 intrudes on the inside of the nozzle that has not undergone the cleaning processing. As a result, over-etching occurs at the tip end portions of the inner wall of the nozzles 41 to 45 and the nozzles 46 to 50. However, in this embodiment, the inert gas is supplied to the nozzle that has undergone the cleaning processing and the nozzle that has not undergone the cleaning processing. Thus, intrusion of the cleaning gas to these nozzles is inhibited. As a result, the over-etching due to the intrusion of the cleaning gas is prevented.

(4) Gas Supply Operation of the Gas Supply System 232

Next, the gas supply operation of the gas supply system 232 will be explained.

(4-1) Operation for Performing the Film Deposition Processing

First, the operation for performing the film deposition processing will be explained. The film deposition processing has the steps of: supplying the first processing gas to the upper stream side of the gas flow; supplying the first processing gas to the middle parts of the gas flow; supplying the second processing gas to the upper stream side of the gas flow; and supplying the second processing gas to the middle parts of the gas flow; and forming the thin film.

First, the air valves 121 to 125, 137 to 146, 156 to 160 are opened by the controller 240, and other air valves 126 to 136, and 147 to 155 are closed.

Thus, the first processing gas (DCS gas) is supplied to the nozzles 41 to 45, via the piping parts 61 to 66, 89 to 93, 105 to 109.

Then, the first processing gas is supplied to the upper stream side outside of the region (product wafer/monitor wafer arrangement region R1) where a plurality of wafers 200 loaded into the processing chamber 201 are arranged (supply to the upper stream side of the gas flow of the first processing gas).

In addition, the first processing gas is supplied to the middle parts of the gas flow in the region (product wafer/monitor wafer arrangement region $R_1$) where the plurality of wafers 200 are arranged (supply of the first processing gas to the middle parts of the gas flow). Namely, the first processing gas is respectively supplied to approximately first wafer from the nozzle 44, approximately 26-th wafer from the nozzle 43, approximately $51^{st}$ wafer from the nozzle 42, and approximately 76-th wafer from the nozzle 41 of the stacked 100 wafers 200. At this time, the first processing gas is supplied from the upper stream side of the gas flow, namely from the lower side of the processing chamber 201.

In addition, in this case, regarding the first processing gas supplied to the nozzles 41 to 45, a target value of the flow rate per unit time is designated. Thus, the flow rate of the first processing gas supplied to the nozzles 41 to 45 is controlled by the MFCs 171 to 175. As a result, the flow rate of the first processing gas supplied to the nozzles 41 to 45 per unit time is set as the aforementioned target value.

In addition, simultaneously with supplying the first processing gas (DCS gas) to the nozzles 41 to 45, the second processing gas (NH3 gas) is supplied to the nozzles 46 to 50, via the piping parts 75 to 80 and 94 to 98.

Then, from the nozzle 50, the second processing gas is supplied to the upper stream side outside of the region (product wafer/monitor wafer arrangement region R1) where the plurality of wafers 200 loaded into the processing chamber 201 (supply of the second processing gas to the upper stream side of the gas flow).

In addition, from the nozzles 46 to 49, the second processing gas is supplied to the middle parts of the gas flow in the region (product wafer/monitor wafer arrangement region R1) where the plurality of wafers 200 are arranged (supply of the second processing gas to the middle parts of the gas flow). Namely, the second processing gas is respectively supplied to approximately first wafer from the nozzle 49, approximately 26-th wafer from the nozzle 48, approximately $51^{st}$ wafer from the nozzle 47, and approximately 76-th wafer from the nozzle 46 of 100 stacked wafers 200.

In addition, in this case, regarding the second processing gas, the target value of the flow rate per unit time supplied to the nozzles 46 to 50 is designated. Thus, the flow rate per unit time of the second processing gas supplied to the nozzles 46 to 50 is controlled by the MFCs 178 to 182. As a result, the flow rate of the second processing gas per unit time supplied to the nozzles 46 to 50 is set to be the aforementioned target value.

As described above, in this embodiment, the first processing gas (DCS gas) and the second processing gas (NH$_3$ gas) are simultaneously supplied into the processing chamber 201 and are thermally decomposed, and a chemical reaction occurs between one element (Si) contained in the first processing gas (DCS gas) and one element contained in the second processing gas (NH$_3$), to form an amorphous material (Si$_3$N$_4$), and the Si$_3$N$_4$ (nitride silicon) film is formed on the plurality of wafers 200 (the step of forming the thin film). The reaction formula at this time is as follows.

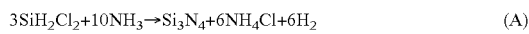

$$3SiH_2Cl_2 + 10NH_3 \rightarrow Si_3N_4 + 6NH_4Cl + 6H_2 \quad (A)$$

Specifically, as shown in FIG. 15, regarding the first processing gas supplied from the nozzle 45 and the second processing gas supplied from the nozzle 50, the chemical reaction occurs between one element contained in the first processing gas and one element contained in the second processing gas, to form the amorphous material, and the thin film is mainly formed on the first to 25-th wafer of the wafers 200 from the upper stream side (lower side of the processing chamber 201) of the gas flow. Also, the first processing gas supplied from the nozzle 43 and the second processing gas supplied from the nozzle 48 are thermally decomposed. Then, one element contained in the first processing gas and the chemical reaction occurs between one element contained in the first processing gas and one element contained in the second processing gas, and the thin film is mainly formed on the 26-th to 50-th wafers 200. Similarly, the thin film is formed on the 76-th to 100-th wafers 200 by supplying the processing gas from the nozzle 42 and the nozzle 47, and the thin film is formed on the 51-st to 75-th wafers 200 by supplying the processing gas from the nozzle 41 and the nozzle 46, and the thin film is formed on the 76-th to 100-th wafers 200 by supplying the processing gas from the nozzle 41 and the nozzle 46.

Note that in order to accelerate the reaction between the first processing gas and the second processing gas, preferably the temperature of the main surface of the wafer 200 is increased to the temperature at which both of the first processing gas and the second processing gas are thermally decomposed. Namely, the inside of the processing chamber 201 is preferably heated and maintained, so as to be made uniform over the entire body of the region where the wafers 200 are arranged, at a selected temperature in a temperature range from 600° C. to 800° C. For example, consumption of the DCS gas is increased when the temperature of the main surface of the wafer 200 is set at approximately 760° C.

In addition, there is such a characteristic that when the reaction temperature of the first processing gas and the second processing gas is changed, a composition rate of a silicon (Si) element and nitrogen element (N) in the formed nitride silicon film is changed. Also, there is such a characteristic that when the composition rate of the silicon element and the nitrogen element is changed, dielectric constant of the nitride silicon film is changed. Accordingly, in order to uniformly maintain a film quality of the nitride silicon film between wafers 200, preferably the main surface temperature of each wafer 200 is maintained substantially uniform over the entire body of the region (product wafer/monitor wafer arrangement region R1) where a plurality of wafers 200 are arranged. Note that the same thing can be said for the oxide film formed on the wafer 200.

Further, in order to uniformly maintain the composition rate of the silicon element and the nitrogen element in the nitride silicon film, and the composition rate of the silicon element and the oxygen element in the oxide film, between the plurality of wafers 200, it is preferable to substantially uniformly maintain the ratio of the supply amounts of the first processing gas and the second processing gas over the entire body of the region (product wafer/monitor wafer arrangement region R1) where the plurality of wafers 200 are arranged. Accordingly, it is preferable to make the flow rate ratio same substantially, between the flow rate ratio of the supply amount of the gas supplied to the middle parts of the gas flow of the first processing gas to the supply amount of the gas supplied to the upper stream side of the gas flow of the first processing gas, and the flow rate ratio of the supply amount of the gas supplied to the middle parts of the gas flow of the second processing gas to the supply amount of the gas supplied to the upper stream side of the gas flow of the second processing gas.

Note that as described above, when the nitride silicon film is collectively formed on the plurality of wafers 200, the supply amount of the NH$_3$ gas is made to be 3 times or 10 times the supply amount of the DCS gas, to form the nitride silicon film with a small film stress and uniform between the wafers 200 and in-surface of the wafer 200.

(4-2) Operation for Performing after-Purge Processing of the Processing Gas

Next, the operation for performing the after-purge processing of the processing gas will be explained.

In this case, the air valves 126 to 136, 148, 156 to 160 are opened, and other air valves 121 to 125, 137 to 147, 149 to 155 are closed. Thus, the inert gas is supplied to the nozzles 46 to 50, via the piping parts 67, 68, 99 to 103, and 94 to 98. In this case, the flow rate per unit time of the inert gas supplied to the nozzles 46 to 50 is controlled by the MFC 176, based on an instruction of the controller 240.

In addition, simultaneously with the supply of the inert gas to the nozzles 46 to 50, the inert gas is supplied to the nozzles 41 to 45, via the piping parts 69, 70 to 74, 89 to 93, and 105 to 109. In this case, the flow rate per unit time of the inert gas supplied to the nozzles 41 to 45 is controlled by the MFC 177, based on the instruction of the controller 240.

In addition, at this time, the vacuum exhaust processing is executed by the vacuum exhaust device 246. As a result, the residual gas remained in the gas supply system 232, the processing chamber 201, and the exhaust system 231 is removed to the outside of the exhaust system 231.

(4-3) Operation for Performing the Cleaning Processing

Explanation will be given hereunder for the operation for performing the cleaning processing of the inner wall, etc, of the process tube 203 and the inner wall of the nozzles 41 to 45.

In the multi-system nozzle type CVD device, the temperature of a region confronted with the heater 206 out of an inner wall of the process tube 203 and an outer wall of the nozzles 41 to 44, and 46 to 49 is increased up to a film deposition temperature of $Si_3N_4$. Therefore, the $Si_3N_4$ film, being the reaction product, is deposited on the region confronted with the heater 206 out of the inner wall of the process tube 203 and the outer wall of the nozzles 41 to 44 and 46 to 49. Then, the reaction product is peeled off when its deposit amount is increased, resulting in particles. Accordingly, the inner wall of the process tube 203 and the outer wall of the nozzles 41 to 44, and 46 to 49 must be cleaned.

In addition, the temperature of the region confronted with the heater 206 out of the nozzles 41 to 44 and 46 to 49 is also increased up to the film deposition temperature. Thus, mainly the DCS gas is thermally decomposed at 500° C. or more, and Poly-Si, being the reaction product, is deposited on the inner wall of the nozzles 41 to 44 for supplying the DCS gas in particular. Further, although the deposit is smaller than the deposit of Poly-Si due to a thermal decomposing reaction of the DCS gas on the inner wall of the nozzles 41 to 44, the $Si_3N_4$ film, etc, being the reaction product, is formed on the inner wall of the nozzles 41 to 44, by allowing the $NH_3$ gas and an $N_2$ component obtained by thermally decomposing the $NH_3$ gas to enter into the nozzles 41 to 44. Then, when the deposit amount is increased, the reaction product is peeled off, resulting in particles. Accordingly, the inner wall of the nozzles 41 to 44 must also be cleaned similarly to the inner wall of the process tube 203.

In addition, in a process of deposing the $Si_3N_4$ film on the wafer 200, ammonium chloride ($NH_4Cl$), being the reaction product, is generated (see the aforementioned reaction formula (A)). Then, the ammonium chloride mainly flows to the lower stream side of the gas flow rather than the region confronted with the heater 206. Then, the ammonium chloride is adhered to the inner wall, etc, of the exhaust pipe constituting the exhaust system 7 of the lower streams side when the temperature is set in a low temperature state of under 150° C. or around. In addition, although in a smaller amount, the ammonium chloride is also generated on the upper stream side of the gas flow rather than the region confronted with the heater 206. Then, when the temperature is set in a low temperature state of under 150° C. or around, the ammonium chloride is adhered to the inner wall, etc, of the upper stream side and is solidified. The solidified ammonium chloride is also peeled off when its deposit is increased, resulting in particles. Accordingly, the inner wall, etc, of the process tube 203, being the outside region confronted with the heater 206, must also be cleaned.

In addition, the nozzle 45 for film deposition is provided in a lower part of the region confronted with the heater 206. Therefore, the temperature inside of the nozzle 45 is not increased up to the film deposition temperature, and there is almost no reaction product deposited on the inner wall of the nozzle 45. However, the ammonium chloride also flows into the nozzle 45. Then, when the temperature is set in a low temperature state of under 150° C. or around, the ammonium chloride is adhered to the inner wall, etc, of the nozzle 45 and is solidified. The solidified ammonium chloride causes the nozzle 45 to clog, or flies after adhering to the inner wall, etc, to allow the particles to generate. Accordingly, the inner wall of the nozzle 45 must also be cleaned.

In this case, the air valves 137 to 146 are closed by the controller 240. Thus, supply of the first processing gas to the nozzles 46 to 50 is inhibited. In addition, in this case, the air valves 126, 127 to 131 are opened. Thus, the inert gas is supplied to the nozzles 46 to 50 via the piping parts 94 to 98. In this case, the flow rate per unit time of the inert gas supplied to the nozzles 46 to 50 is controlled by the MFC 176, based on the instruction of the controller 240.

In addition, in this case, the air valves 149 and 150 are opened. Thus, the cleaning gas is supplied to the nozzle 51 via the piping parts 81 and 88. In this case, the flow rate per unit time of the cleaning gas supplied to the nozzle 51 is controlled by the MFC 184, based on the instruction of the controller 240.

Further, in this case, the air valves 121 to 125 are closed, and the air valves 132 to 136, 148, and 156 to 160 are opened. Thus, the supply of the second processing gas to the nozzles 41 to 45 is inhibited, and the supply of the inert gas becomes possible. In this case, which nozzles 41 to 55 are supplied with the inert gas, is decided by which inner walls of the nozzles 41 to 45 are cleaned.

Further, in this case, the air valves 147, and 151 to 155 are opened. Thus, the supply of the cleaning gas to the nozzles 41 to 45 becomes possible. In this case, which nozzles 41 to 45 are supplied with the cleaning gas, is decided by which inner walls of the nozzles 41 to 55 are cleaned.

Now, the inner wall of the nozzle 41 is assumed to be cleaned. In this case, the air valve 151 is opened, and the air valves 152 to 155 are closed. Also in this case, the air valves 157 to 160 are opened, and the air valve 156 is closed. Thus, in this case, the cleaning gas is supplied to a gas input port (base end portion) of the nozzle 41, and the inert gas is supplied to the gas input port of the nozzles 42 to 45. As a result, in this case, the inner wall of the nozzle 41 is cleaned and the over-etching of the inner walls of the nozzles 42 to 45 are prevented.

When a cleaning object is switched to the nozzle 42 from this state, the air valve 152 is opened this time, and the air valves 151, and 153 to 155 are closed. In addition, in this case, the air valves 156, and 158 to 160 are opened, and the air valve 157 is closed. Thus, in this case, the cleaning gas is supplied to the gas input port of the nozzle 42, and the inert gas is supplied to the gas input port of the nozzles 41, and 43 to 45. As a result, in this case, the inner wall of the nozzle 42 is cleaned, and the over-etching of the inner wall of the nozzles 41, and 43 to 45 is prevented.

When the cleaning object is switched to the nozzle 43 from this state, the air valve 153 is opened this time, and the air valves 151, 152, 154, and 155 are closed. In addition, in this case, the air valves 156, 157, 159, and 160 are opened, and the air valve 158 is closed. Thus, in this case, the cleaning gas is supplied to the gas input port of the nozzle 43, and the inert gas is supplied to the gas input port of the nozzles 41, 42, 44, and 45. As a result, in this case, the inner wall of the nozzle 43 is cleaned, and the over-etching of the inner walls of the nozzles 41, 42, 44, and 45 is prevented.

In the same way hereunder, the inner wall of the nozzle 44 is cleaned, and the over-etching of the inner wall of the nozzles 41 to 43, and 45 is prevented. In addition, the inner wall of the nozzle 45 is cleaned, and the over-etching of the inner wall of the nozzles 41 to 44 is prevented.

Note that in the cleaning operation hereunder, the flow rate per unit time of the cleaning gas supplied to the nozzles 41 to 45 is controlled by the MFC 183, based on the instruction of the controller 240. Similarly, the flow rate per unit time of the inert gas supplied to the nozzles 41 to 45 is controlled by the MFC 177, based on the instruction of the controller 240.

In this case, the flow rate per unit time of the cleaning gas supplied to the nozzles 41 to 45 is decided based on a length of a part on which the reaction product is deposited. This is because the cleaning time of the nozzles 41 to 55 is set to be same. Thus, the flow rate per unit time of the cleaning gas supplied to the nozzles 41 to 45 is largest at the nozzle 41, secondary large at the nozzle 42, thirdly large at the nozzle 43, fourthly large at the nozzle 44, and smallest at the nozzle 45.

Note that as described above, kinds and the film thickness are different, among the reaction product deposited on the inner wall of the process tube 203 and the outer wall of the nozzles 41 to 44 and 46 to 49, the reaction product deposited on the inner wall of the nozzles 41 to 44, and reaction product deposited on the outside region confronted with the heater 206 and on the inner wall of the nozzle 45. Therefore, when these reaction products are cleaned, preferably cleaning conditions are optimized according to the kind and film thickness of each reaction product and simultaneously efficient cleaning is performed.

(4-4) Operation for Performing after-Purge Processing of the Cleaning Gas

Next, the operation for performing the after-purge processing of the cleaning gas will be explained.

In this case, the air valves 126, 150, 148, 132 to 136, 156 to 160 are opened, and other air valves 121 to 125, 127 to 131, 137 to 147, 149, and 151 to 155 are closed. Thus, the inert gas is supplied to the nozzle 51 via the piping parts 67, 68, 88. In this case, the flow rate per unit time of the inert gas supplied to the nozzle 51 is controlled by the MFC 176, based on the instruction of the controller 240.

In addition, simultaneously with the supply of the inert gas to the nozzle 51, the inert gas is supplied to the nozzles 41 to 45, via the piping parts 67, 69, 70 to 74, 89 to 93, and 105 to 109. In this case, the flow rate per unit time of the inert gas supplied to the nozzles 41 to 45 is controlled by the MFC 177, based on the instruction of the controller 240.

In addition at this time, the vacuum exhaust processing is executed by the vacuum exhaust device 246. As a result, the residual gas remained in the gas supply system 232, the processing chamber 201, and the exhaust system 231 is removed to the outside of the exhaust system 231.

(1-3) Advantages

As described above in detail, according to the embodiments of the present invention, the following one or more advantages are exhibited.

(1) As described above, when the processing gas is supplied only from the nozzles 45 and 50, a large amount of processing gas must be supplied into the processing chamber 201. However, the boat 217 and the plurality of wafers 200 exist in the processing chamber 201, and therefore there is not a small exhaust resistance. Therefore, the pressure on the upper stream side of the gas flow becomes higher than the pressure on the lower stream side of the gas flow, thus relatively increasing a reaction speed on the upper stream side of the gas flow. As a result, in the wafer 200 placed on the upper stream side of the gas flow having high reaction speed, the film of a peripheral edge portion of the wafer 200 becomes thick and the film in a central part of the wafer 200 becomes thin, thus deteriorating uniformity of the film thickness in the surface of the wafer 200 in some cases. In addition, the thickness of the formed thin film is different, between the wafer 200 placed on the upper stream side of the gas flow having a high reaction speed, and the wafer 200 placed on the lower stream side of the gas flow having a low reaction speed. For example, as shown in FIG. 12(*b*), in some cases, the uniformity of the film thickness between wafers 200 is deteriorated. FIG. 12(*b*) shows a film thickness distribution when the temperature gradient is not provided in the plurality of wafers in the method of not supplying the processing gas to the middle parts. Particularly, when the wafer 200 has a further large diameter or the pattern on the surface of the wafer is further densified, the problem becomes remarkable. Further, under a different pressure condition, the composition raten of the formed thin film is changed, and a film quality (for example, the dielectric constant, a stress value, and an etching rate) is also changed.

Meanwhile, according to this embodiment, the first processing gas (DCS gas) and the second processing gas ($NH_3$ gas) are supplied from the middle parts of the gas flow, by using the nozzles 41 to 44 and nozzles 46 to 49. Thus, the supply amount of the processing gas on the upper stream side of the gas flow can be reduced, and a pressure difference between the upper stream side and the lower stream side of the gas flow can be corrected (made small). As a result, the film thickness between the wafers 200 and the uniformity of the composition rate are improved, and the film thickness in the surface of the wafer 200 and the uniformity of the composition rate are also improved.

(2) In addition, the processing gas supplied to the upper stream side of the gas flow in the processing chamber 201 is reacted and consumed mainly on the main surfaces of the plurality of wafers 200, in accordance with the flow from the upper stream side to the lower stream side in the processing chamber 201. Therefore, when the processing gas is supplied only from the nozzles 45 and 50, the processing gas becomes gradually insufficient on the lower stream side of the gas flow. As a result, the reaction speed becomes low on the lower stream side of the gas flow, and the thickness of the formed thin film becomes gradually thin, and for example as shown in FIG. 12B, the uniformity in the film thickness between the wafers 200 is deteriorated in some cases. Particularly, when the wafer 200 has a further large diameter or the pattern on the surface of the wafer becomes further densified, an amount of consumed gas is increased, thus making the problem remarkable.

Meanwhile, according to this embodiment, the first processing gas (DCS gas) and the second processing gas ($NH_3$ gas) are supplied in the form of replenishing from the middle parts of the gas flow. Accordingly, even when the wafer 200 has a further large diameter or the pattern on the surface of the wafer is further densified, the difference in the supply amount in a stacking direction (the upper stream side and the lower stream side of the gas flow) of the wafers 200 can be reduced, thus making it possible to make the film thickness between the wafers 200 uniform, and improve the uniformity in the surface of the wafer 200.

(3) In addition, the processing gas supplied from the nozzles 41 to 50 is supplied to a prescribed region while being gas flow-controlled independently. Therefore, the difference in the supply amount in the stacking direction of the wafers 200 can be further reduced, thus making it possible to make the film thickness between the wafers 200 uniform and improve further uniformity in the surface of the wafer 200.

(4) Thus, it is possible to reduce an influence of a film thickness fluctuation caused by consuming the processing gas, and deterioration in film thickness characteristics such as a reduction of a CVD film coverage of the pattern. According to this embodiment, eight nozzles 41 to 44, and 46 to 49 are raised in the processing chamber in which 100 wafers are installed, and from the respective four places, the first processing gas or the second processing gas is respectively supplied. As a result, one gas supply point is in charge of the film deposition (gas supply) to 25 wafers, and the film thickness fluctuation caused by consuming the processing gas and the influence of the deterioration in the film deposition characteristics such as the reduction of the CVD film coverage of the pattern can be reduce by 25%, compared to a case of depositing 100 films by one supply point. Accordingly, even when the wafer 200 has a further larger diameter, and the pattern on the surface of the wafer is further densified, excellent film deposition characteristics can be maintained similarly to a case that the pattern on the surface of the wafer is not densified.

(5) Particularly, in the wafer having a large diameter of 300 mm or more, a high productivity can be realized, while maintaining excellent film deposition characteristics on the wafer having high pattern density by a pressure reducing CVD method. As a result, the wafer having a large diameter of 300 mm or more can realize both of high productivity and low loading effect. Here, the loading effect refers to a state that when the wafer 200 having high pattern density (namely, large surface areas with many irregularities) is processed, the processing gas is easily consumed by a reaction with the wafer 200 on the upper stream side, and therefore the film thickness tends to be different (the film becomes thinner on the lower stream side) between the wafer on the upper stream side and the wafer on the lower stream side, thus deteriorating the uniformity between the wafers 200.

(6) In addition, as described above, when the reaction temperature of the first processing gas and the second processing gas is changed, there is such characteristics that the composition rate of the silicon (Si) element and the nitrogen element (N) in the formed nitride silicon film and the composition rate of the silicon (Si) element and the oxygen (O) element in the oxide film are changed. Also, there is such characteristics that when the composition rate of the silicon element and the nitrogen element and the composition rate of the silicon element and the oxygen element are changed, the dielectric constant of the nitride silicon film and the oxide film is changed. Here, in order to solve a non-uniformity of the film thickness, when film deposition is performed so that the temperature in the processing chamber 201 is maintained to be gradually increased, from the upper stream side of the gas flow (lower side of the processing chamber) to the lower stream side of the gas flow (upper side of the processing chamber), as shown in FIG. 12(*a*), loading effect can be suppressed. However, this causes the composition rate of silicon and nitrogen to change, and results in a non-uniform film quality such as the dielectric constant between wafers 200. FIG. 12(*a*) shows a film thickness distribution in a method of not supplying the processing gas to middle parts, when a temperature gradient is formed on a plurality of wafers.

Meanwhile, according to this embodiment, the thin film can be formed without forming the temperature gradient in the processing chamber. Therefore, the thin film with uniform film thickness and uniform film quality such as the dielectric constant can be formed.

(7) Particularly, when the particles are generated on the upper stream side beyond a wafer placement region, the particles are easily adhered to the thin film, etc, on the wafer 200. Therefore, preferably ammonium chloride is not allowed to be adhered to the thin film on the upper stream side beyond the wafer placement region. According to this embodiment, the gas is supplied even in the middle place of the gas flow of the wafer placement region, thus making it possible to make the gas supply amount small on the upper stream side beyond the wafer placement region, and an amount of formation of ammonium chloride on the upper stream side can be suppressed.

In addition, there is a component composed of a metal member such as a manifold on the upper stream side beyond the wafer placement region. Cl-based substances such as ammonium chloride and DCS gas react with metal, thereby separating elements such as Fe and Cu from the metal member. When this metal element is adhered to the wafer 200, a device failure is caused thereby. According to this embodiment, the Cl-based gas is supplied in the middle, even in the middle parts of the gas flow of the wafer placement region. Therefore, the gas supply amount in the wafer placement region can be made small, a formation amount of the ammonium chloride on the upper stream side can be suppressed, and metal contamination can be suppressed.

(8) In addition, according to this embodiment, the $Si_3N_4$ film accumulated in a region opposed to the heater 206, out of the inner wall of the process tube 203 and the outer wall of the nozzles 41 to 44 and 46 to 49, is subjected to cleaning processing by supplying the cleaning gas from the nozzle 51. Meanwhile, when the Poly-Si film, etc, accumulated on the inner walls of the nozzles 41 to 45 is subjected to cleaning processing, it is performed by supplying the cleaning gas to an entire body of the inner walls of the nozzles 41 to 45. As a result, it becomes possible to apply cleaning processing to the deposit of different kind, and it is possible to clean the inner wall of the process tube 203 and the outer walls of the nozzles 41 to 44 and 46 to 49, and the entire body of the inner walls of the nozzles 41 to 45.

(9) Further, according to this embodiment, the inert gas is supplied to the nozzle to which no cleaning gas is supplied, out of the nozzles 41 to 45. Thus, over-etching of the nozzles 41 to 45 can be prevented.

(10) By cleaning the entire body of the inner walls of the nozzles 41 to 45, and by preventing the over-etching of the nozzles 41 to 45, the service life of the nozzles 41 to 45 can be extended. As a result, a replacement cycle of the nozzles 41 to 45 can be extended. Specifically, when the replacement cycle of the nozzles 41 to 45 in a conventional device is set as one month, this cycle can be extended to six months in this embodiment. Thus, the number of times of time-consuming replacement work (detaching and attaching work) can be reduced to ⅙ of the conventional number of times. As a result, an operating rate of the device can be improved.

(11) Further in addition, according to this embodiment, the flow rate of the cleaning gas per unit time supplied to the nozzles 41 to 45 is decided based on, for example, a length of a part on which the reaction product is deposited. Thus, the same cleaning time for the inner walls of the nozzles 41 to 45 can be obtained. Therefore, in addition to cleaning the nozzles 41 to 45 by sequentially selecting the nozzle one by one, it is also possible to clean the nozzles 41 to 45 by simultaneously selecting a plurality of nozzles. This contributes to shortening the time required for cleaning.

(2) Second Embodiment

As described above, the gas capable of depositing the film by itself is used as the first processing gas. Therefore, thermal decomposing reaction of the DCS gas occurs on the inner wall of the nozzles 41 to 44 for supplying the first processing gas (DCS gas), to deposit the Poly-Si film. Meanwhile, the gas not capable of depositing the film by itself is used as the second processing gas ($NH_3$ gas). Namely, similarly to the DCS gas, a part of the $NH_3$ gas causes the thermal decomposing reaction to occur. However, in this case, the $NH_3$ gas is decomposed into $N_2$ and $H_2$, and therefore the thin film is not deposited on the inner walls of the nozzles 46 to 49. Accordingly, the thin film is not deposited on the inner walls of the nozzles 46 to 49, unless backflow (invasion) of the DCS gas and Si component obtained by thermally decomposing the DCS gas occurs. From such a circumstance, in the first embodiment, the piping part 88 for supplying the cleaning gas ($NF_3$ gas) is not connected to the piping parts 94 to 98 for supplying the $NH_3$ gas, and only the inner walls of the supply nozzles 41 to 45 for supplying the DCS gas are cleaned.

However, although the deposit amount is smaller than that of the inner walls of the nozzles 41 to 45 for supplying the DCS gas, the reaction product such as a solid material composed of the ammonium chloride ($NH_4Cl$) is also adhered to the inner walls of the nozzles 46 to 50 for supplying the $NH_3$ gas. Accordingly, preferably not only the inner walls of the nozzles 41 to 45 but also the inner walls of the nozzles 46 to 50 are cleaned. In the multi-system nozzle type CVD device of this embodiment, as shown in FIG. 2, similarly to the nozzles 41 to 45, the inner walls of the nozzles 46 to 50 can also be cleaned.

(2-1) structure

FIG. 2 is a view showing the structure of the gas supply system of the processing furnace according to a second embodiment of the present invention. A basic constitutional element is the same as the constitutional element corresponding to the first embodiment explained by using FIG. 1, and therefore explanation therefore is omitted. Different points between the structure of the second embodiment and the structure of the first embodiment are as follows. Namely, piping parts 110 to 115, valves 161 to 166, 167 to 171, and MFC 185 are added.

In the second embodiment, the lower stream side end portion of the piping part 81 is connected to the upper stream side end portion of the piping part 110. The lower stream side end portion of the piping part 110 is connected to the upper stream side end portions of the piping parts 111 to 115. The lower stream side end portions of the piping parts 111 to 115 are respectively connected to the upper stream side end portions of the piping parts 94 to 98.

The air valves 161 and the MFC 185 are inserted into the piping part 110. In this case, the MFC 185 is inserted into the lower stream side of the air valve 161. The air valves 162 to 166 are respectively inserted into the piping parts 111 to 115. The air valves 167 to 171 are respectively inserted into the piping parts 94 to 98 of the lower stream side from the connection part between the lower stream side end portion of the piping parts 99 to 103 and the upper stream side end portion of the piping parts 94 to 98.

Note that the air valves 162 to 166 and the air valves 167 to 171 a function of selectively supplying into the nozzles 46 to 50, the cleaning gas flowing through the piping parts 111 to 115 and the gas (the processing gas or the inert gas) flowing through the piping parts 77 to 80 and 79 to 103.

(2-2) Operation for Performing the Cleaning Processing

Next, an operation for performing the cleaning processing to the inner walls of the nozzles 46 to 50 will be explained.

In this case, the air valves 137 to 146 are closed by the controller 240, and the air valves 127 to 131, and 167 to 171 are opened. Thus, the supply of the second processing gas ($NH_3$ gas) to the nozzles 46 to 50 is inhibited, thus making it possible to supply the inert gas. In this case, which nozzle 46 to 50 is selected to supply the inert gas, is decided by which nozzles 46 to 50 is selected to clean the inner wall.

Further in addition, in this case, the air valves 161 to 166 are opened. Thus, the supply of the cleaning gas to the nozzles 46 to 50 becomes effective. In this case, which nozzles 46 to 50 is selected to supply the cleaning gas, is decided by which nozzles 46 to 50 is selected to clean the inner wall.

Now, the inner wall of the nozzle 46 is assumed to be cleaned. In this case, the air valve 162 is opened, and the air valves 163 to 166 are closed. In addition in this case, the air valves 128 to 131, and 168 to 171 are opened, and the air valves 127 and 167 are closed. Thus, in this case, the cleaning gas is supplied to a gas input port (base end portion) of the nozzle 46, and the inert gas is supplied to the gas input ports of the nozzles 47 to 50. As a result, in this case, the inner wall of the nozzle 46 is cleaned, and the over-etching of the inner wall of the nozzles 47 to 50 is prevented.

When a cleaning object is switched to the nozzle 47 from this state, the air valve 163 is opened this time, and the air valves 162, and 164 to 166 are closed. Also, in this case, the air valves 127, 129 to 131, 167, and 169 to 171 are opened, and the air valves 128 and 168 are closed. Thus, in this case, the cleaning gas is supplied to the gas input port of the nozzle 47, and the inert gas is supplied to the gas input port of the nozzles 46, and 48 to 50. As a result, in this case, the inner wall of the nozzle 47 is cleaned, and the over-etching of the inner wall of the nozzles 46, and 48 to 50 is prevented.

When the cleaning object is switched to the nozzle 48 from this state, the air valve 164 is opened this time, and the air valves 162 to 163, and 165 to 166 are closed. Also, in this case, the air valves 127, 128, 130, 131, 167, 168, 170, and 171 are opened, and the air valves 129 and 169 are closed. Thus, in this case, the cleaning gas is supplied to the gas input port of the nozzle 48, and the inert gas is supplied to the gas input ports of the nozzles 46, 47, 49, and 50. As a result, in this case, the inner wall of the nozzle 48 is cleaned, and the over-etching of the inner walls of the nozzles 46, 47, 49, and 50 is prevented.

In the same way hereunder, the inner wall of the nozzle 49 is cleaned, and the over-etching of the inner walls of the nozzles 46 to 48, and 50 is prevented. Also, the inner wall of the nozzle 50 is cleaned, and the over-etching of the inner walls of the nozzles 46 to 49 is prevented.

Note that in the cleaning operation as described above, the flow rate of the cleaning gas per unit time supplied to the nozzles 46 to 50 is controlled by the MFC 185, based on an instruction of the controller 240. Similarly, the flow rate of the inert gas per unite time supplied to the nozzles 46 to 50 is controlled by the MFC 185, based on the instruction of the controller 240.

In this case, the flow rate of the cleaning gas per unit time supplied to the nozzles 46 to 50 is decided based on, for example, the length of a portion on which the reaction product is deposited. This is because the cleaning time for the nozzles 46 to 50 is set to be same. Thus, the flow rate of the cleaning gas per unit time supplied to the nozzles 46 to 50 is largest in the nozzle 46, secondary largest in the nozzle 47, thirdly largest in the nozzle 48, fourthly largest in the nozzle 49, and smallest in the nozzle 50. Note that in cleaning the nozzles 46 to 50, the inert gas is supplied to five nozzles 41 to 45 from the piping parts 105 to 109, respectively.

(2-3) Operation for Performing after-Purge Processing of the Cleaning Gas

Next, the operation for performing the after-purge processing of the cleaning gas will be explained.

In this case, air valves 126, 150, 148, 132 to 136, and 156 to 160 are opened, and other air valves 121 to 125, 127 to 131, 137 to 147, 149, and 151 to 155 are closed. Thus, the inert gas is supplied to the nozzle 51 via the piping parts 67, 68 and 88. In this case, the flow rate of the inert gas per unit time supplied to the nozzle 51 is controlled by the MFC 176, based on the instruction of the controller 240.

In addition, simultaneously with supplying the inert gas to the nozzle 51, the inert gas is supplied to the nozzles 46 to 50 via the piping parts 67 to 68, 99 to 103, and 94 to 98. In this case, the flow rate of the inert gas per unit time supplied to the nozzles 46 to 50 is controlled by the MFC 176, based on the instruction of the controller 240.

In addition at this time, vacuum exhaust processing is executed by a vacuum exhaust device 246. As a result, residual gas remained in the gas supply system 232, in the processing chamber 201, and in the exhaust system 231 is removed to the outside of the exhaust system 231.

(2-4) Advantages

As described above, according to the second embodiment explained as described above in detail, the following one or more advantages are provided.

(1) According to this embodiment, the cleaning processing is applied to the $Si_3N_4$ film deposited on a region opposed to the heater 206 out of the inner wall of the process tube 203 and the outer walls of the nozzles 41 to 44, and 46 to 49, by supplying the cleaning gas from the nozzle 51. Meanwhile, when the cleaning processing is applied to the Si3N4 film of small deposit amount compared to that on the inner wall of the process tube 203 deposited on the inner walls of the nozzles 46 to 50, the cleaning gas is supplied to the entire body of the inner walls of the nozzles 46 to 50. As a result, the cleaning processing can also be applied to the deposit of a different amount, without over-etching of the process tube and the nozzle, etc, thus making it possible to clean the entire body of the inner wall of the process tube, the outer walls of the nozzles 41 to 44, and 46 to 49, and the inner walls of the nozzles 46 to 50.

(2) Further, according to this embodiment, the inert gas is supplied to the nozzle to which the cleaning gas is not supplied. Thus, the over-etching of the nozzles 46 to 50 can be prevented.

(3) By cleaning the entire body of the inner walls of the nozzles 46 to 50, and by preventing the over-etching of the nozzles 46 to 50, the service life of the nozzles 46 to 50 can be extended. As a result, the replacement cycle of the nozzles 46 to 50 can be extended. Specifically, when the replacement cycle of the nozzles 46 to 50 in a conventional device is assumed to be 1 month, this replacement cycle can be extended to 6 months in this embodiment. Thus, the number of times of time-consuming replacement works (detaching and attaching works) can be reduced to ⅙ of the conventional number of times. As a result, the operating rate of the device can be improved.

(4) Further in addition, according to this embodiment, the flow rate of the cleaning gas per unit time supplied to the nozzles 46 to 50 is decided based on, for example, the length of a part on which the reaction product is deposited. Thus, the same cleaning time required for the inner walls of the nozzles 46 to 50 can be obtained. Thus, it becomes possible to clean not only one nozzle out of the nozzles 46 to 50 by sequentially selecting it one by one, but also a plurality of nozzles out of the nozzles 46 to 50 by selecting them simultaneously. This contributes to shortening the cleaning time.

(3) Third Embodiment

In the processing chamber 202 according to this embodiment, as shown in FIG. 5, only the nozzle that supplies the first processing gas (DCS gas) is set as the multi-system nozzles. Namely, a different point of the third embodiment from the first embodiment is that in the third embodiment, there is provided only the nozzle 50 as a nozzle for supplying the second processing gas ($NH_3$ gas) into the processing chamber 201, and the nozzles 46 to 49 are not provided. The other structure is the same as that of the processing furnace 202 according to the first embodiment.

Thus, in the film deposition processing according to this embodiment, only the first processing gas is supplied to the middle parts, and the second processing gas is not supplied to the middle parts. Namely, another different point of the third embodiment from the first embodiment is that in the third embodiment, the second processing gas is not supplied to the middle parts of the gas flow and the second processing gas is supplied only to the upper stream side outside of the wafer arrangement region R, and is not supplied to the middle parts of the gas flow in a region where a plurality of wafers 200 are arranged (product wafer/monitor wafer arrangement region $R_1$).

In the third embodiment, as shown in FIG. 5, thermal decomposition occurs between the first processing gas supplied from the nozzle 45 and the second processing gas supplied from the nozzle 50, thereby allowing chemical reaction to occur between one element contained in the first processing gas and one element contained in the second processing gas, and the amorphous material is formed, so that the thin film is formed on first to 25-th wafer 200 from mainly the upper stream side (lower side in the processing chamber 201) of the gas flow. In addition, the thermal reaction occurs between the first processing gas supplied from the nozzle 43 and the second processing gas supplied from the nozzle 50, thus allowing the chemical reaction to occur between one element contained in the first processing gas and one element contained in the second processing gas, and the amorphous material is formed so that the thin film is formed on mainly the 26-th to 50-th wafer 200. Then, similarly, the thin film is formed on the 51-st to 75-th wafer 200 by the first processing gas supplied from the nozzle 42 and the remaining second processing gas supplied from the nozzle 50, and the thin film is formed on the 76-th to 100-th wafer 200 by the first processing gas supplied from the nozzle 41 and the second processing gas supplied from the nozzle 50.

The other operation is the same as that of the film deposition processing according to the first embodiment.

By this embodiment also, the same advantage of that of the first embodiment can be obtained. Particularly, FIG. 13 is a graph showing a thickness distribution between wafers of the thin film formed by the method of supplying the processing gas to the middle parts, and FIG. 13A shows a film thickness distribution in a case that the DCS gas and the $NH_3$ gas are supplied to the middle parts, and only the DCS gas is supplied to the middle parts. Then, designation mark • shows the film thickness distribution in a case that the DCS gas and the NH3 gas are supplied to the middle parts, and designation mark Δ shows the film thickness distribution in a case that only the DCS gas is supplied to the middle parts. According to FIG. 13A, even in a case that only the DCS gas is supplied to the middle parts, it is found that the film thickness between wafers 200 is uniform, in the same way as the case of supplying the DCS gas and the $NH_3$ gas to the middle parts. This is because since the film can not be generated by the second processing gas ($NH_3$ gas) singularly, the second processing gas is frequently remained in a state of gas, compared to the first processing gas (DCS gas). Therefore, even if not compensating the second processing gas in the middle, it is possible to improve the film thickness between wafers 200 and the uniformity of the film quality.

In addition, FIG. 14 shows a distribution between wafers of a refractive index of the thin film when the thin film is formed by the method of not supplying the processing gas to the middle parts (when the conventional art is used), and a distribution between wafers of the refractive index of the thin film when the thin film is formed by the method of supplying the processing gas to the middle parts. Note that in FIG. 14, designation mark □ shows a case of using the conventional art, and designation mark ◇ shows a case that only the first processing gas (DCS gas) in the middle by using the multi-system nozzle, and designation mark Δ shows a case that both gases of the first processing gas (DCS gas) and the second processing gas (NH$_3$ gas) are supplied in the middle by using the multi-system nozzle. According to FIG. 14, it is found that even in a case that only the DCS gas is supplied to the middle parts (designation mark ◇, the difference in the refractive index is small between wafers 200. In addition, when both gases of the NH$_3$ gas and the DCS gas are supplied to the middle parts, it is found that the difference in the refractive index between wafers 200 is further small. Note that unless the refractive index is not uniform, it can be said that the composition rate is not uniform, either.

Note that in this embodiment, preferably the supply amount of the second processing gas supplied to the upper stream side of the gas flow of the second processing gas is set more increased than a total flow amount of the supply amount of the first processing gas supplied to the upper stream side of the gas flow of the first processing gas and the supply amount of the first processing gas supplied to the middle parts of the gas flow of the first processing gas. As described above, the Poly-Si film can be deposited by the first processing gas (DCS gas) by itself. This is because if a state (so-called NH$_3$ gas-rich state) is not created, in which a sufficient amount of the second processing gas exists in a region where the first processing gas is supplied, the Poly-Si film and an Si$_x$N$_x$ film of different composition rate with little amount of element N is deposited on the main surface of the wafer 200, thus making it impossible to form a desired Si$_3$N$_4$ film. Further preferably, when the first processing gas is supplied in the middle to a plurality of places, the supply amount of the middle parts of the plurality of places on the lower stream side is made larger than that of the upper stream side. Thus, the difference in pressure on the upper stream side and the lower stream side of the gas flow can be corrected (made small).

(4) Fourth Embodiment

In the processing furnace 202 according to this embodiment, as shown in FIG. 6, only the nozzle for supplying the first processing gas (DCS gas) is set as the multi-system nozzle, and in addition, a supply place of the first processing gas is further increased. Namely, in this embodiment, a different point from the first embodiment is that only the nozzle 50 is used without using the nozzles 46 to 49 as the nozzle for supplying the second processing gas (NH$_3$ gas) to the middle parts, and the nozzles 41 to 45, and 46a to 49a are used as the nozzle for supplying the first processing gas to the processing chamber 201. The other structure is the same as that of the processing furnace 202 according to the first embodiment.

Here, tip end portions of the nozzles 41 to 44, and 46a to 49a are positioned at the middle parts of the gas flow in a region where a plurality of wafers 200 loaded into the processing chamber 201 are arranged. Specifically, the tip end portion of each nozzles 41 to 44 is positioned in a plurality of middle parts with mutually different positions (heights) provided along the gas flow. For example, each tip end portion of the nozzles 46a to 49a, and 41 to 44 is respectively positioned on approximately 88-th, 76-th, 63-th, 51-th, 39-th, 26-th, 13-th, and first of 100 wafers counted from approximately the bottom (upper stream side of the gas flow).

Thus, in the film deposition processing according to this embodiment, the first processing gas is supplied to further plurality of middle parts, and the second processing gas is not supplied to the middle parts. Namely, in this embodiment, in supplying the first processing gas to the middle parts of the gas flow, the first processing gas is supplied to 8 middle parts. In addition, the second processing gas is not supplied to the middle parts of the gas flow, and the second processing gas is supplied only to the upper stream side outside of the wafer arrangement region R, and is not supplied to the middle parts of the gas flow in the region where a plurality of wafers 200 are arranged (product wafer/monitor wafer arrangement region R$_1$).

According to this embodiment, as shown in FIG. 13B, by further increasing the supply parts of the first processing gas, the film thickness between wafers 200 can be made further uniform. FIG. 13 is a graph showing the film thickness distribution between wafers of the thin film formed by the method of supplying the processing gas to the middle parts, and FIG. 13B shows the film thickness distribution when the supply part of the DCS gas is further increased.

(5) Fifth Embodiment

In the processing furnace 202 according to this embodiment, as shown in FIG. 7, a different point from the first embodiment is that the nozzles 46 to 49 for supplying the second processing gas (NH$_3$ gas) to the middle parts are respectively raised to be slightly lower (shorter) than the nozzles 41 to 44 for supplying the first processing gas (DCS gas) to the middle parts. Note that in the first embodiment, the nozzles 41 to 44 for supplying the first processing gas (DCS gas) to the middle parts are raised (extended) in a vertical direction (arrangement direction of the substrate), so as to be reach almost the same height (length) respectively, corresponding to the nozzles 46 to 49 for supplying the second processing gas (NH$_3$) gas to the middle parts.

Accordingly, in the film deposition processing according to this embodiment, a different point from the film deposition processing is that the second processing gas supplied to the middle parts in the supply of the first processing gas to the middle parts of the gas flow, is supplied from the upper stream side of the gas flow more than the first processing gas supplied in the supply of the second processing gas to the middle parts of the gas flow. The other operation is the same as the operation according to this embodiment.

According to this embodiment, the second processing gas (NH$_3$ gas) is supplied from slightly upper stream side more than the first processing gas (DCS gas). Therefore, a state (NH$_3$ gas-rich state) is easily created, in which a sufficient amount of NH$_3$ gas exists in advance in a region within the processing chamber 201 to which the DCS gas is supplied. As a result, the reaction between the DCS gas and the NH$_3$ gas is accelerated, thus suppressing a phenomenon in which the Si$_x$N$_x$ film and the Poly-Si film with different composition rate are deposited on the main surface of the wafer 200, making it easy to form a desired SiN film.

According to this embodiment, an NH$_3$ gas rich state can be easily created without increasing the supply amount of the second processing gas, and this is preferable.

Further, according to this embodiment, the nozzles 46 to 49 for supplying the second processing gas (NH3 gas) to the middle parts are respectively raised to be slightly lower (upper stream side of the gas flow) than the nozzles 41 to 44 for supplying the first processing gas (DCS gas) to the middle parts. As a result, in the vicinity of the gas supply ports of the nozzles 46 to 49, the reaction between the first processing gas and the second processing gas is suppressed, thus making it possible to suppress the generation of particles.

(6) Sixth Embodiment

In the processing furnace 202 according to this embodiment, as shown in FIG. 8, the firs gas supply nozzle for supplying the first processing gas into the processing chamber 201, and the second gas supply nozzle for supplying the second processing gas into the processing chamber 201 are arranged, so that nozzles with substantially same lengths (nozzles 41 and 46, nozzles 42 and 47, nozzles 43 and 48, and nozzles 44 and 49) are adjacent to each other, and more preferably, are alternately arranged so as to be adjacent to each other. Namely, the nozzles with almost the same heights (nozzles 41 and 46, nozzles 42 and 47, nozzles 43 and 48, and nozzles 44 and 49) out of the nozzles 41 to 44 and the nozzles 46 to 49 are arranged so as to be adjacent to each other. Then, more preferably the first gas supply nozzles (nozzles 41 to 44) and the second gas supply nozzles (nozzles 46 to 49) are alternately arranged. Note that FIG. 8 is a block diagram showing the structure of the gas supply nozzle of the processing furnace constituting a part of the substrate processing apparatus of a sixth embodiment, and (a) shows a flat sectional view of the processing furnace, and (b) is a schematic view showing an arrangement of the gas supply nozzles in the processing furnace.

According to this embodiment, the gas supply port of the first gas supply nozzle and the gas supply port of the second gas supply nozzle are adjacent to each other. Therefore, mixture of the gas flow can be accelerated, thus making it possible to accelerate the reaction between the first processing gas and the second processing gas.

(7) Seventh Embodiment

In the processing furnace 202 according to this embodiment, as shown in FIG. 9, the first gas supply nozzle and the second gas supply nozzle are arranged, so that the nozzles of substantially the same lengths are adjacent to each other, and more preferably arranged so that they are alternately adjacently arranged. Further, the gas supply port of the first gas supply nozzle is constituted so as to horizontally supply the first processing gas (DCS gas) toward the center of the wafer 200, and the gas supply port of the second gas supply nozzle is constituted so s to supply the second processing gas (NH3 gas) toward the gas flow of the first processing gas directed toward the center of the wafer 200. Note that FIG. 9 is a block diagram showing the structure of the gas supply nozzle of the processing furnace constituting a part of the substrate processing apparatus of a seventh embodiment, and (a) shows a flat sectional view of the processing furnace, and (b) shows a schematic view showing an arrangement of the gas supply nozzles in the processing furnace.

According to this embodiment, the gas supply port of the first gas supply nozzle and the gas supply port of the second gas supply nozzle are adjacent to each other, and in addition, the second processing gas is supplied toward the gas flow of the first processing gas. This contributes to further accelerating the mixture of the gas flow and further accelerating the reaction between the first processing gas and the second processing gas.

(8) Eighth Embodiment

In the processing furnace 202 according to this embodiment, as shown in FIG. 10, the first gas supply nozzle and the second gas supply nozzle are arranged so that the nozzles of substantially the same lengths are adjacent to each other, and more preferably alternately arrange so as to be adjacent to each other. Further, the second gas supply nozzle is made shorter than the first gas supply nozzle. In addition, the $NH_3$ gas is supplied from the gas supply port of the second gas supply nozzle in a vertical direction, and the DCS gas is supplied from the gas supply port of the first gas supply nozzle toward the gas flow of the $NH_3$ gas. Note that FIG. 10 is a block diagram showing the structure of the gas supply nozzle of the processing furnace constituting a part of the substrate processing apparatus of an eighth embodiment, and FIG. 10A shows a flat sectional view of the processing furnace, and FIG. 10B is a schematic view showing the arrangement of the gas supply nozzles in the processing furnace.

According to this embodiment, the gas supply port of the first gas supply nozzle and the gas supply port of the second gas supply nozzle are adjacent to each other, and in addition, the first processing gas (DCS gas) is supplied toward the gas flow of the second processing gas ($NH_3$ gas). This contributes to accelerating the mixture of the gas flow and further accelerating the reaction between the first processing gas and the second processing gas.

(9) Ninth Embodiment

In the processing furnace 202 according to this embodiment, as shown in FIG. 11, a different point from the first embodiment is that the first gas supply nozzle is not constituted as the multi-system nozzle, but is constituted as one porous nozzle 41' having a plurality of gas supply ports provided at different positions in the vertical direction (arrangement direction of the substrates).

The porous nozzles 417 are raised (extended) inside of the processing chamber 201 in the vertical direction (arrangement direction of the substrates). In addition, the base end portions of the porous nozzles 41' are positioned outside of the side wall of the manifold 209, via nozzle through holes formed on the side wall of the manifold 209. A plurality of gas supply ports are respectively provided in the porous nozzles 41', inside of the wafer arrangement region R and at a plurality of middle parts provided along the gas flow at mutually different positions. Preferably, the gas supply amount from the plurality of gas supply ports provided in the porous nozzles 41' is set so as to be uniform between gas supply ports. For example, by providing the gas supply port so that a hole diameter of the gas supply port becomes larger toward the lower stream side of the gas flow (upper side in the processing chamber 201), the gas supply amount can be made uniform between the gas supply ports.

According to this embodiment also, the same advantage as that of the first embodiment can be obtained. In addition, according to this embodiment, the first gas supply nozzle is not constituted as the multi-system nozzle (a plurality of nozzles). Therefore, it is not necessary to prepare a plurality of mass flow controllers and supply tubes for every plurality of nozzles constituting the multi-system nozzle. This contributes to reducing a manufacturing cost of the substrate processing apparatus.

Note that the present invention is not limited to the above-described embodiments. For example, the first gas supply nozzle may be constituted as the multi-system nozzle, and the second gas supply nozzle may be constituted as the porous nozzle. In addition, both of the first gas supply nozzle and the second gas supply nozzle may be constituted as the porous nozzles. Further, a plurality of porous nozzles may be provided for every gas species of the processing gas. Further, only a part of the gas supply nozzles out of the plurality of gas supply nozzles constituting the multi-system nozzle may be summarized. In addition, more preferably, regarding the positions of the plurality of gas supply ports provided for each porous nozzle provided for every gas species of the processing gas, similarly to the gas output ports of the above-described embodiments 1, 2, 5 to 7, the gas supply ports of approximately the same hole diameter may be disposed in approximately the same height of each of the plurality of porous nozzles, and the gas supply ports of one of the porous nozzles may be disposed slightly on the upper stream side. This makes it possible to obtain the same advantage. In addition, preferably the tip end portion of the porous nozzle is closed and the plurality of gas supply ports are provided on the side wall. Thus, gas amount supplied from each gas supply port is easily uniformized.

(10) Tenth Embodiment

In the above-described embodiments, the DCS gas is used as the first processing gas. However, the embodiment of the present invention is not limited to the aforementioned embodiments. Namely, as the first processing gas, for example, Cl-based gas such as TCS (Tetrachlorosilane) gas, HCD (Hexachlorodisilane) gas, and Si-based gas such as BTBAS (bis tertiar-butyl amino silane) can be used. Note that the chemical formula of TCS is $SiCl_4$, the chemical formula of HCD is $Si_2Cl_6$, and the chemical formula of BTBAS is $SiH_2[NH(C_4H_9)]_2$.

Note that when the TCS gas, the HCD gas, and the BTBAS gas are used as the first processing gas, reaction conditions are for example set as 20 to 400 cc of gas supply amount, 500 to 700° C. of main surface temperature of the wafer 200, and 20 to 100 Pa of the pressure in the processing chamber 201.

(11) Eleventh Embodiment

In the above-described embodiments, 100 wafers 200 are held by the boat 217 in multiple stages, and the second gas supply nozzle and the fourth gas supply nozzle are respectively constituted as four multi-system nozzles. However, the present invention is not limited to the above-described embodiments. Namely, the number of wafers 200 held by the boat 217 may be increased or decreased, and further the number of multi-system nozzles constituting the second gas supply nozzle or the fourth gas supply nozzle may be set as different number respectively. For example, when 125 wafers 200 are held in the boat 217 at a prescribed pitch (such as 6.3 mm) in multiple stages, and the number of the multi-system nozzles constituting the second gas supply nozzle or the fourth gas supply nozzle is set as 9, the fluctuation of the thickness of the thin film formed between wafers 200 can be reduced to 1% or less of the film thickness at maximum.

(12) Twelfth Embodiment

In the above-described embodiment, supply of the first processing gas to the upper stream side of the gas flow, supply of the first processing gas to the middle part of the gas flow, supply of the second processing gas to the upper stream side of the gas flow, and supply of the second processing gas to the middle part of the gas flow are simultaneously performed. Namely, the first processing gas (DCS gas) or the second processing gas ($NH_3$ gas) are simultaneously supplied into the processing chamber 201 from the nozzles 41 to 50.

However, a supply order of the gas in the present invention is not limited to the above-described embodiments. Namely, each step is not executed simultaneously but may be sequentially executed according to a prescribed order. In addition, in the supply of the first processing gas to the middle part of the gas flow and the supply of the second processing gas to the middle part of the gas flow, the processing gas may be supplied from a plurality of multi-system nozzles simultaneously, or the processing gas may be supplied sequentially in a prescribed order (for example from the upper stream side of the gas flow).

For example, a start order or a stop order of each step may be decided, so that a supply time of the processing gas to the wafer 200, in which the thickness of the formed thin film becomes narrower, is made longer than the supply time of the processing gas to other wafer 200. Under a loading effect phenomenon, the thickness of the thin film formed on the wafer 200 placed on the lower stream side of the gas flow (upper side in the processing chamber 201) is likely to be narrower than the thickness of the thin film formed on the wafer 200 placed on the upper stream side of the gas flow (lower side in the processing chamber 201). In this case, preferably the gas supply to the lower stream side of the gas flow is started prior to the gas supply to the upper stream side or stopped thereafter. Namely, the supply of the first processing gas to the middle part of the gas flow and the supply of the second processing gas to the middle part of the gas flow is started prior to executing the supply of the first processing gas to the upper stream side of the gas flow and the supply of the second processing gas to the upper stream side or stopped thereafter. Further, in the supply of the first processing gas to a plurality of middle parts, at mutually different positions, provided along the gas flow (supply of the first processing gas at different height positions in the processing chamber 201 in a substrate placement region) and the supply of the second processing gas to the plurality of middle parts at mutually different positions, provided along the gas flow (supply of the second processing gas at different height positions in the processing chamber 201 in the substrate placement region), the supply time of the processing gas is preferably started prior to gas supply or stopped thereafter, so as to be longer than the supply time of the processing gas to the wafer 200 placed on the upper stream side. Thus, the uniformity of the film thickness between wafers 200 can be made uniform.

In addition, for example, when the film thickness of the thin film formed on the wafer 200 placed on the lower stream side of the gas flow is thinner than the thickness of the thin film formed on the wafer 200 placed on the upper stream side, the start order or the stop order of the gas supply may be decided so that the gas capable of not creating the film by itself such as $NH_3$-rich state can be easily created. Namely, the gas supply may be started in an order of supply of the second processing gas to the middle part of the gas flow→supply of the first processing gas to the middle part of the gas flow→supply of the second processing gas to the upper stream side of the gas flow→supply of the first processing gas to the upper stream side of the gas flow, or the gas supply may be stopped in an order opposite to the above-described order. Further, in the supply of the first processing gas to the middle part of the gas flow and the supply of the second processing gas to the middle part of the gas flow, the start order or the stop order of the gas supply may be decided, so that the $NH_3$ gas-rich state can be easily created in each region. Namely, in the supply of the first processing gas to a plurality of middle parts at mutually different positions, provided along the gas flow and the supply of the second processing gas to the plurality of middle parts at mutually different positions, provided along the gas flow, preferably the supply of the gas is started into the processing chamber 201 and the gas supply into the processing chamber 201 is stopped, in an order of, for example, nozzle 49→nozzle 44→nozzle 48→nozzle 43→nozzle 47→nozzle 42→nozzle 46→nozzle 41. Thus, the reaction between the DCS gas and the $NH_3$ gas can be accelerated, the phenomenon, in which the $Si_xN_x$ film or the Poly-Si film with different composition ratio is deposited on the main surface of the wafer 200, can be suppressed, and a desired $Si_3N_4$ film can easily formed.

(13) Thirteenth Embodiment

In the processing furnace according to this embodiment, as shown in FIG. 16, the second gas supply nozzle for supplying the second processing gas is disposed between the first gas supply nozzles for supplying the first processing gas. Preferably, the second gas supply nozzle for supplying the second processing gas is disposed at approximately the central position between the first gas supply nozzles for supplying the first processing gas. Thus, the mixture of the gas can be accelerated.

(14) Fourteenth Embodiment

In the aforementioned embodiment, the process tube 203 as the reaction tube is constituted as a double tube of the inner tube 204 as an inner reaction tube and the outer tube 205 as an outer reaction tube provided outside of the inner tube 204. However, the present invention is not limited to the aforementioned embodiments. Namely, the process tube 203 may be constituted as a single tube not having the inner tube 204.

(15) Other Embodiment

As described above, various embodiments of the present invention have been explained. However, the present invention is not limited to the aforementioned embodiments. For example, preferred aspects of the present invention are as follows.

a first aspect provides a manufacturing method of a semiconductor device including the steps of:

loading a plurality of substrates into a processing chamber;
supplying a first processing gas containing at least one element out of a plurality of elements constituting a thin film formed on a main surface of the substrate and capable of depositing a film by itself, to an upper stream side of a gas flow outside of a region where the plurality of substrates loaded into the processing chamber are arranged, supplying a second processing gas containing at least one element out of the plurality of elements and not capable of depositing the film by itself, to the upper stream side of the gas flow outside of the region where the plurality of substrates loaded into the processing chamber are arranged, supplying the first processing gas to a middle part of the gas flow within the region where the plurality of substrates loaded into the processing chamber are arranged, and forming an amorphous material by allowing the first processing gas and the second processing gas to react with each other in the processing chamber, and forming the thin film on the main surfaces of the plurality of substrates; and unloading the substrate after forming the thin film from the processing chamber.

A second aspect provides the manufacturing method of the semiconductor device according to the first aspect, wherein supply of the first processing gas to the middle part of the gas flow includes the supply of the first processing to a plurality of middle parts provided along the gas flow at mutually different positions, in a region where the plurality of substrates loaded into the processing chamber are arranged.

A third aspect provides the manufacturing method of the semiconductor device according to the first or second aspect, further including the supply of the second processing gas to the middle part of the gas flow in the region where the plurality of substrates loaded into the processing chamber are arranged.

A fourth aspect provides the manufacturing method of the semiconductor device according to the second aspect, further including the supply of the second processing gas to the middle part of the gas flow in the region where the plurality of substrates loaded into the processing chamber are arranged, and the supply of the second processing gas to the middle part of the gas flow includes the supply of the second processing gas to a plurality of middle parts provided along the gas flow at mutually different positions, in the region where the plurality of substrates loaded into the processing chamber are arranged.

A fifth aspect provides the manufacturing method of the semiconductor device according to the third aspect, wherein the supply of the second processing gas to the middle part of the gas flow includes the supply of the second processing gas to the middle part of the gas flow provided at substantially the same position as the middle part to which the first processing gas is supplied.

A sixth aspect provides the manufacturing method of the semiconductor device according to the third aspect, wherein the supply of the second processing gas to the middle part of the gas flow includes the supply of the second processing gas to the middle part of the gas flow provided on an upper stream side of the gas flow beyond the middle part, in adjacent to the middle part to which the first processing gas is supplied.

A seventh aspect provides the manufacturing method of the semiconductor device according to the first aspect, wherein in the step of forming the thin film, a temperature of main surfaces of the plurality of substrates loaded into the processing chamber is increased to a temperature at which at least both of the first processing gas and the second processing gas are thermally decomposed, and the temperature of the main surface between the plurality of substrates is maintained to be substantially uniform over an overall region where the plurality of substrates are arranged.

An eighth aspect provides the manufacturing method of the semiconductor device according to the third aspect, wherein in the step of forming the thin film, a temperature of main surfaces of the plurality of substrates loaded into the processing chamber is increased to a temperature at which at least both of the first processing gas and the second processing gas are thermally decomposed, and the temperature of the main surface between the plurality of substrates are maintained to be substantially uniform over an overall region where the plurality of substrates are arranged.

A ninth aspect provides the manufacturing method of the semiconductor device according to the first aspect, wherein in the supply of the first processing gas to an upper stream side of the gas flow, the first processing gas is supplied into the processing chamber while controlling a gas flow rate, and in the supply of the first processing gas to the middle part of the gas flow, the first processing gas is supplied from a second gas supply part into the processing chamber while controlling a gas flow amount independently of a control of a gas flow amount in the first gas supply part.

A tenth aspect provides the manufacturing method of the semiconductor device according to the third aspect, wherein in the supply of the second processing gas to the upper stream side of the gas flow, the second processing gas is supplied from a third gas supply part into the processing chamber while controlling the gas flow amount, and in the supply of the second processing gas to the middle part of the gas flow, the first processing gas is supplied into the processing chamber from a fourth gas supply part, wile controlling a gas flow amount independently of a control of a gas flow amount in the third gas supply part.

An eleventh aspect provides the manufacturing method of the semiconductor device according to the first aspect, wherein in the step of forming the thin film, the plurality of substrates loaded into the processing chamber are arranged in a horizontal posture, with spaced apart from each other in multiple stages.

A twelfth aspect provides the manufacturing method of the semiconductor device according to the first aspect, wherein the first processing gas is a gas containing a silicon element, and the second processing gas is a gas containing a nitrogen element or an oxygen element, and the thin film is a thin film formed of an amorphous material containing the silicon element and the nitrogen element or the thin film formed of the amorphous material containing the silicon element and the oxygen element.

A thirteenth aspect provides the manufacturing method of the semiconductor device according to the first aspect, wherein the first processing gas is a gas containing a chlorine element, and the second processing gas is a gas containing a nitrogen element or an oxygen element.

A fourteenth aspect provides the manufacturing method of the semiconductor device according to the twelfth aspect, wherein the first processing gas is a gas of any one of TCS, HCD, and BTBAS, and the second processing gas is an $NH_3$ gas.

A fifteenth aspect provides the manufacturing method of the semiconductor device according to the first aspect, wherein in the supply of the first processing gas to the middle part of the gas flow, the first processing gas is supplied via a nozzle, and the nozzle allows the gas to flow to the middle part in a region where the plurality of substrates loaded into the processing chamber are arranged, from an upper stream side of the gas flow outside of the region where the plurality of substrates loaded into the processing chamber are arranged.

A sixteenth aspect provides the manufacturing method of the semiconductor device according to the second aspect, wherein in the supply of the first processing gas to the middle part of the gas flow, the first processing gas is supplied via a plurality of nozzles with mutually different lengths, and the plurality of nozzles with different lengths allow the gas to flow from an upper stream side of the gas flow outside of the region where the plurality of substrates loaded into the processing chamber are arranged, to a plurality of middle parts at mutually different positions, provided along the gas flow in a region where the plurality of substrates loaded into the processing chamber are arranged.

A seventeenth aspect provides the manufacturing method of the semiconductor device according to the third aspect, wherein in the supply of the second processing gas to the middle part, the second processing gas is supplied via a nozzle, and the nozzle allows the gas to flow to the middle part in a region where the plurality of substrates loaded into the processing chamber are arranged, from an upper stream side of the gas flow outside of the region where the plurality of substrates loaded into the processing chamber are arranged.

An eighteenth aspect provides the manufacturing method of the semiconductor device according to the fourth aspect, wherein in the supply of the second processing gas to the middle part of the gas flow, the second processing gas is supplied via a plurality of nozzles with mutually different lengths, and the plurality of nozzles with different lengths allow the gas to flow to a plurality of middle parts, at mutually different positions, provided along the gas flow in a region where the plurality of substrates loaded into the processing chamber are arranged, from an upper stream side of the gas flow outside of the region where the plurality of substrates loaded into the processing chamber are arranged.

A nineteenth aspect provides the manufacturing method of the semiconductor device according to the third embodiment, wherein in the supply of the second processing gas to the middle part of the gas flow, the second processing gas is supplied to join the gas flow of the first processing gas in the supply of the first processing gas to the middle part of the gas flow.

A twentieth aspect provides the manufacturing method of the semiconductor device according to the nineteenth aspect, wherein in the supply of the first processing gas to the middle part of the gas flow, the first processing gas is supplied toward a center of main surfaces of the plurality of substrates loaded into the processing chamber.

A twenty-first aspect provides the manufacturing method of the semiconductor device according to the fourth aspect, wherein in the supply of the first processing gas to the middle part of the gas flow, the first processing gas is supplied via first plurality of nozzles with mutually different lengths, and in the supply of the second processing gas to the middle part of the gas flow, the second processing gas is supplied via second plurality of nozzles with mutually different lengths, with nozzles of the first plurality of nozzles having substantially same lengths being arranged so as to be adjacent to each other.

A twenty-second aspect provides the manufacturing method of the semiconductor device according to the first aspect, wherein the step of forming the thin film includes the step of causing the first processing gas and the second processing gas supplied to an upper stream side of the gas flow outside of the region where the plurality of substrates are arranged, to react with each other to form an amorphous material, and forming the thin film on the main surfaces of the plurality of substrates; and the step of causing the first processing gas and the second processing gas supplied to the middle part in a region where the plurality of substrates loaded into the processing chamber are arranged, to react with each other, to form an amorphous material, and forming the thin film on the main surfaces of the plurality of substrates on a lower stream side beyond the middle part to which the first processing gas is supplied.

A twenty-third aspect provides the manufacturing method of the semiconductor device according to the third aspect, wherein the step of forming the thin film includes the step of causing the first processing gas supplied to the upper stream side of the gas flow outside of the region where the plurality of substrates loaded into the processing chamber are arranged, and the second processing gas supplied to the upper stream side of the gas flow, to react with each other to form an amorphous material; and the step of causing the first processing gas supplied to the middle part and the second processing gas supplied to the middle part, to react with each other to form the amorphous material, and forming the thin film on the plurality of substrates on the lower stream side beyond the middle part to which the first processing gas is supplied.

A twenty-fourth aspect provides a manufacturing method of a semiconductor device including the step of loading a plurality of substrates into a processing chamber; supplying ammonia-based gas or nitrogen oxide gas to an upper stream side of a gas flow outside of a region where the plurality of substrates loaded into the processing chamber are arranged, while supplying a gas containing silane-based gas to a middle part on an upper stream side of the gas flow outside of the region where the plurality of substrates loaded into the processing chamber are arranged and a middle part in a region where the plurality of substrates loaded into the processing chamber are arranged, then causing the gas containing the silane-based gas and the ammonia-based gas or the nitrogen oxide gas to react with one another, thereby forming a thin film on main surfaces of the plurality of substrates.

A twenty-fifth aspect provides the manufacturing method of the semiconductor device according to the first aspect, wherein a supply amount of the second processing gas to the upper stream side is larger than a total amount of a supply amount of the first processing gas supplied to the upper stream side of the gas flow and a supply amount of the first processing gas supplied to the middle part of the gas flow.

A twenty-sixth aspect provides the manufacturing method of the semiconductor device according to the third aspect, wherein a supply amount of a gas supplied to a middle part of a gas flow of the first processing gas to a supply amount of a gas supplied to the upper stream side of a gas flow of the first processing gas, and a supply amount of a gas supplied to the middle part of the gas flow of the second processing gas to a supply amount of a gas supplied to the upper stream side of the gas flow of the second processing gas, are substantially same.

A twenty-seventh aspect provides a substrate processing apparatus, having a processing chamber that forms a thin film on a main surface of a plurality of substrates;

a heater provided outside of the processing chamber, for heating an inside of the processing chamber;

a first gas supply part containing at least one element of a plurality of elements constituting the thin film formed on the main surface of the substrate, for supplying a first processing gas capable of depositing a film by itself to a gas flow outside of a region where the plurality of substrates loaded into the processing chamber are arranged, which is a region not opposed to the heater in the processing chamber;

a second gas supply part provided independently of the first gas supply part, for supplying the first processing gas to a middle part of a gas flow in a region where the plurality of substrates loaded into the processing chamber are arranged, which is a region opposed to the heater in the processing chamber;

a third gas supply part that supplies a second processing gas containing at least other one element of the plurality of elements and not capable of depositing the film by itself, to an upper stream side of the gas flow outside of the region where the plurality of substrates loaded into the processing chamber are arranged, which is the region not opposed to the heater in the processing chamber;

an exhaust part provided on a lower stream side of the gas flow outside of the region where the plurality of substrates loaded into the processing chamber are arranged, which is the region not opposed to the heater in the processing chamber; and a controller that controls so as to cause the first processing gas and the second processing gas to react with each other in the processing chamber to form an amorphous material, and form a thin film of the plurality of substrates.

A twenty-eighth aspect provides the substrate processing apparatus according to the twenty-seventh aspect, wherein the second gas supply part has a plurality of first gas supply nozzles with mutually different lengths, and the first gas supply nozzles are respectively extended from an upper stream side of the gas flow outside of the region where the plurality of substrates loaded into the processing chamber are arranged, up to a plurality of middle parts of mutually different positions, provided along the gas flow in a region where the plurality of substrate loaded into the processing chamber are arranged.

A twenty-ninth aspect provides the substrate processing apparatus according to the twenty-seventy or twenty-eighth aspect, further having a fourth gas supply part that supplies the second processing gas to the middle part of the gas flow in a region where the plurality of substrates loaded into the processing chamber are arranged, which is the region opposed to the heater in the processing chamber.

A thirtieth aspect provides the substrate processing apparatus according to the twenty-eighth aspect, further including the fourth gas supply part that supplies the second processing gas to the middle part of the gas flow in a region where the plurality of substrates loaded into the processing chamber are arranged, which is the region opposed to the heater in the processing chamber, wherein the fourth gas supply part has a plurality of gas supply nozzles with mutually different lengths, and the second gas supply nozzles are respectively extended to a plurality of middle parts provided along the gas flow at mutually different positions in a region where the plurality of substrates are loaded into the processing chamber, from an upper stream side of the gas flow outside of the region where the plurality of substrates loaded into the processing chamber are arranged.

A thirty-first aspect provides the substrate processing apparatus, further having a temperature controller that controls the heater, so that a main surface temperature of the plurality of substrates loaded into the processing chamber is increased up to a temperature at which at least both of the first processing gas and the second processing gas are thermally decomposed, and the main surface temperature between the plurality of substrates is maintained to be substantially equal to each other over an overall region where the plurality of substrates are arranged.

A thirty-second aspect provides the substrate processing apparatus according to the thirtieth aspect, wherein the first gas supply nozzle and the second gas supply nozzle are arranged, so that the nozzles of substantially same lengths are adjacent to each other.

A thirty-third aspect provides a manufacturing method of a semiconductor device, including the steps of:

loading a plurality of substrates into a processing chamber;

supplying a first processing gas from a first gas supply part to an upper stream side of a gas flow outside of a region where the plurality of substrates loaded into the processing chamber are arranged;

supplying the first processing gas to middle parts corresponding to a region where the plurality of substrates loaded into the processing chamber are arranged, from a second gas supply part provided independently of the first gas supply part;

supplying from a third gas supply part a second processing gas of gas species different from the first processing gas, to an upper stream side of the gas flow outside of the region where the plurality of substrates loaded into the processing chamber are arranged;

supplying the second processing gas form a fourth gas supply part independent of the third gas supply part, to approximately the same middle part as the middle part for supplying the first processing gas from the second gas supply part;

causing the first processing gas and the second processing gas in the processing chamber to react with each other, to process the plurality of substrates; and unloading an already processed substrate form the processing chamber.

According to the thirty-third aspect, each processing gas is supplied from the middle part in addition to the upper stream side of the gas flow. Therefore, the processing gas can be uniformly supplied to a plurality of substrates, and the film can be uniformly deposited on the plurality of substrates. Accordingly, excellent film deposition characteristics can be realized on the substrate, namely, high productivity can be realized, while maintaining uniformity in film thickness between substrates and in-surface of the substrate.

A thirty-fourth aspect provides a manufacturing method of a semiconductor device, including the steps of:

loading a plurality of substrates into a processing chamber;

supplying from a first gas supply part a first processing gas to an upper stream side of a gas flow outside of a region where the plurality of substrates loaded into the processing chamber are arranged, while controlling a gas flow amount;

supplying the first processing gas to a middle part corresponding to a region where the plurality of substrates loaded into the processing chamber are arranged, from a second gas supply part provided independently of the first gas supply part, while controlling the gas flow amount independently of control of a gas flow amount by the first gas supply part;

supplying from a third gas supply part a second processing gas of gas species different from the first processing gas, to the upper stream side of the gas flow outside of the region where the plurality of substrates loaded into the processing chamber are arranged, while controlling the gas flow amount;

supplying the second processing gas from a fourth gas supply part provided independently of the third gas supply part, to approximately the same middle part as the middle part for supplying the first processing gas from the second gas supply part, while controlling the gas flow amount independently of the control of the gas flow amount by the third gas supply part;

causing the first processing gas and the second processing gas to react with each other in the processing chamber, to process the plurality of substrates; and unloading an already processed substrate from the processing chamber.

According to the thirty-fourth aspect, each processing gas is supplied while controlling the gas flow independently of the middle part in addition to the upper stream side of the gas flow. Therefore, the processing gas can be more uniformly supplied to the plurality of substrates, and the film can be uniformly deposited on the plurality of substrates. Accordingly, further higher productivity can be realized, while maintaining the excellent film deposition characteristics on the substrate.

A thirty-fifth aspect provides a substrate processing apparatus, having:

a processing chamber that processes a plurality of substrates;

a holder that holds the plurality of substrates in the processing chamber;

a first gas supply part that supplies a first processing gas to a substrate from an upper stream side of a gas flow outside of a region where the plurality of substrates are arranged;

a second gas supply part provided independently of the first gas supply part, for supplying the first processing gas to the substrate from a middle part corresponding to the region where the plurality of substrates are arranged;

a third gas supply part that supplies a second processing gas of gas species different from the first processing gas, to the substrate from the upper stream side of the gas flow outside of the region where the plurality of substrates are arranged;

a fourth gas supply part provided independently of the third gas supply part, for supplying the second processing gas to the substrate from approximately the same middle part as the middle part for supplying the first processing gas by the second gas supply part; and an exhaust part that exhausts an inside of the processing chamber form a lower stream side of the plurality of substrates.

According to the thirty-fifth aspect, in addition to the first and third gas supply parts for supplying each processing gas from the upper stream side of the gas flow, the second and fourth gas supply parts are provided for supplying each processing gas from the middle part also. Therefore, the processing gas can be uniformly supplied to the plurality of substrates, and the film can be deposited uniformly on the plurality of substrates. Accordingly, the excellent film deposition characteristics can be realized on the substrate, namely, high productivity can be realized between substrates and in-surface of the substrate, while maintaining the uniformity in film thickness.

A thirty-sixth aspect provides a substrate processing apparatus, having:

a processing chamber that processes a plurality of substrates;

a holder that holds the plurality of substrates in the processing chamber;

a first gas supply part that supplies a first processing gas to a substrate form an upper stream side of a gas flow outside of a region where the plurality of substrates are arranged;

a second gas supply part provided independently of the first gas supply part, for supplying the first processing gas to the substrate form a middle part corresponding to the region where the plurality of substrates are arranged;

a third gas supply part that supplies a second processing gas of gas species different from the first processing gas, to the substrate from the upper stream side of the gas flow outside of the region where the plurality of substrates are arranged;

a fourth gas supply part provided independently of the third gas supply part, for supplying the second processing gas to the substrate from approximately the same middle part as the middle part for supplying the first processing gas by the second gas supply part; and an exhaust part that exhausts an inside of the processing chamber from a lower stream side of the plurality of substrates.

According to the thirty-fifth aspect, in addition to the first and third gas supply parts for supplying each processing gas from the upper stream side of the gas flow, the second and fourth gas supply parts are provided for supplying each processing gas from the middle part also. Therefore, the processing gas can be uniformly supplied to the plurality of substrates, and the film can be uniformly deposited on the plurality of substrates. Accordingly, the excellent film deposition characteristics can be realized on the substrate, namely high productivity can be realized between substrates and in-surface of the substrate, while maintaining the uniformity in film thickness.

A thirty-sixth aspect provides a substrate processing apparatus, having:

a processing chamber that processes a plurality of substrates;

a holder that holds the plurality of substrates in the processing chamber;

a first gas supply part that supplies a first processing gas to a substrate from an upper stream side of a gas flow outside of a region where the plurality of substrates are arranged while controlling a gas flow amount of a first processing gas;

a second gas supply part provided independently of the first gas supply part, for supplying the first processing gas to the substrate from the middle part corresponding to the region where the plurality of substrates are arranged while controlling the gas flow amount independently of the control of the gas flow amount by the first gas supply part;

a third gas supply part that supplies from the upper stream side of the plurality of substrates, a second processing gas of gas species different from the first processing gas, to the substrate from the upper stream side outside of the region where the plurality of substrates are arranged;

a fourth gas supply part provided independently of the third gas supply part, for supplying the second processing gas to the substrate from approximately the same middle part as the middle part for supplying the first processing gas by the second gas supply part, while controlling a gas flow amount independently of a control of the gas flow amount by the third gas supply part; and an exhaust part that exhausts an inside of the processing chamber form a lower stream side of the plurality of substrates.

According to the thirty-sixth aspect, in addition to the first and third gas supply parts for supplying from the upper stream side of the gas flow each processing gas while controlling the gas flow amount, the second and fourth gas supply parts are provided for supplying each processing gas while controlling the gas flow amount independently of the middle part also. Therefore, the processing gas can be further uniformly supplied to the plurality of substrates, and the film can be further uniformly deposited on the plurality of substrates. Accordingly, further high productivity can be realized while maintaining the excellent film deposition characteristics on the substrate.

A thirty-seventh aspect provides the substrate processing apparatus according to the thirty-fifth or thirty-sixth aspect, wherein the second gas supply part is independently provided respectively, including a plurality of first gas supply nozzles for supplying the first processing gas to the substrate from each different middle part corresponding to an area where the plurality of substrates are arranged, and further the fourth gas supply part is independently provided respectively, including a plurality of second gas supply nozzles for supplying the second processing gas to the substrate from the different middle part and approximately the same middle part for supplying the first processing gas.

According to the thirty-seventh aspect, the second gas supply part includes a plurality of first gas supply nozzles for supplying the first processing gas from the different middle part, and the fourth gas supply part includes a plurality of gas supply nozzles for supplying the second processing gas to the different middle part. Therefore, the processing gas can be uniformly supplied to a plurality of substrates, and the film can be uniformly deposited on the plurality of substrates. Accordingly, further higher productivity can be realized, while maintaining the excellent film deposition characteristics on the substrate.

A thirty-eighth aspect provides the substrate processing apparatus according to the thirty-fifth to thirty-seventh aspect, wherein a cleaning gas supply part for supplying cleaning gas into the second gas supply part is connected to the second gas supply part.

According to the thirty-eighth aspect, the cleaning gas supply part is connected to the second gas supply part. Therefore, by supplying the cleaning gas into the second gas supply part, the inside of the second gas supply part can be cleaned. Thus, the service life of the second gas supply part can be extended. As a result, a replacement period of the second gas supply part can be extended. Thus, the number of times of a replacement work of the second gas supply part can be reduced. As a result, an operation rate of the device can be improved.

A thirty-ninth aspect provides the manufacturing method of the semiconductor device according to the thirty-third or thirty-fourth aspect, wherein the second processing gas is a dichlorsilane (DCS) gas.

A forty-first aspect provides the manufacturing method of the semiconductor device according to the thirty-third or thirty-fourth aspect, wherein a nitride silicon film is formed on the already processed substrate.

A forty-second aspect provides the substrate processing apparatus according to the thirty-seventh aspect, wherein the first gas supply nozzle and the second gas supply nozzle are respectively two or more.

(16) Further Other Embodiment (1) For example, in the above-described embodiments, explanation has been given to a case that the flow rate per unit time of the cleaning gas supplied to the nozzles 41 to 45, or nozzles 46 to 50 is set to be a different value, and the cleaning time is set to be same. However, in the present invention, the flow rate per unit time may be set to be same and the cleaning time may be set to be different. In addition, in the present invention, both of the flow rate per unit time and the cleaning time may be set to be different.

(2) Further, in the above-described embodiments, when the cleaning gas is supplied to the nozzles 41 to 45, or nozzles 46 to 50, explanation has been given to a case that they are selected one by one in accordance with a previously defined order, and the cleaning gas is supplied to the selected nozzle. However, in the present invention, a plurality of such nozzles are selected so as to be fewer than a total number, and the cleaning gas may be supplied to the selected plurality of nozzles. In addition, in the present invention, the cleaning gas may be supplied to all nozzles simultaneously. For example, in the cleaning processing of the nozzles 41 to 45, and nozzles 46 to 50, explanation has been given to a case that the flow rate per unit time of the cleaning gas supplied to the nozzles 41 to 45, and nozzles 46 to 50 is controlled by the MFC183 and MFC184, respectively. However, the present invention is not limited thereto, and for example it may be so constituted that instead of the MFC183 and MFC184, the MFC is provided in the piping parts 83 to 87 and piping parts 110 to 115, respectively and based on an instruction of the controller 240, the flow rate per unit time of the cleaning gas may be controlled. Thus, the cleaning processing of the nozzles 41 to 50 can be simultaneously performed, and this is advantageous in terms of productivity.

(3) Further, in the above-described embodiments, explanation has been given to a case that the cleaning processing of the inner walls of the nozzles 46 to 50 is performed simultaneously with the cleaning processing of the inner walls, etc, of the process tube 203. Thus, when the inner wall, etc, of the process tube 203 and the inner walls of the nozzles 41 to 44 are simultaneously cleaned, an overall time required for cleaning the device is reduced, and this is advantageous in terms of the productivity. However, in the present invention, they can be separately performed. In this case, when there is no problem in the invasion of the cleaning gas outputted from the nozzle under cleaning into other nozzles, the inert gas can be supplied only to the nozzle that has just undergone the cleaning processing. Thus, a use amount of the inert gas can be reduced.

Particularly, when an $Si_3N_4$ film explained in the above-described embodiments is deposited on the wafer 200, the $Si_3N_4$ film is deposited on the inner wall, etc, of the process tube 203, and the Poly-Si film is mainly deposited on the inner walls of the nozzles 41 to 44. Therefore, when the cleaning processing is performed by changing the frequency of the cleaning processing to the inner wall, etc, of the process tube 203 and the cleaning processing to the inner walls of the nozzles 41 to 44, respectively, this is effective in controlling to suppress the generation of particles.

In addition, although a small deposit amount, the $Si_3N_4$ film is mainly deposited on the inner wall of the nozzles 46 to 49, and although a small deposit amount, the $NH_4Cl$ film is mainly deposited on the inner wall of the nozzle 50. Therefore, when the cleaning processing is performed by changing the frequency of the cleaning processing to the inner wall, etc, of the process tube 203, the cleaning processing to the inner walls of the nozzles 41 to 44, the cleaning processing to the inner walls of the nozzles 46 to 49, and the cleaning processing to the inner walls of the nozzles 45 and 50 are performed, respectively, this is effective in controlling to suppress the generation of particles. For example, the frequency of the cleaning processing to the inner walls of the nozzles 46 to 49 and the cleaning processing to the inner walls of the nozzles 45 and 50 is set to be fewer than the cleaning processing to the inner wall, etc, of the process tube 203 and the cleaning processing to the inner walls of the nozzles 41 to 44.

(4) In the above-described embodiments, the nozzle 44 and the nozzle 49 are respectively positioned to approximately first wafer that exists in the product wafer/monitor arrangement region $R_1$. However, in a case of excellent substrate in-surface uniformity, substrate inter-surface uniformity, and a quality of the film of the first to 25-th wafers counted from the bottom of the product wafer/monitor wafer deposited by the supply of the gas from the nozzles 45 and the nozzle 50 that stops on the upper stream side of the gas flow outside of the wafer arrangement region R, the nozzle 44 and the nozzle 49 may not be provided. Moreover, when the nozzle 45 and the nozzle 50 are stopped on the upper stream side of the gas flow outside of the wafer arrangement region R, they may be inserted and raised from the bottom in the processing furnace 202.

(5) Further, the present invention can be applied not only to the vertical type CVD apparatus, but also to a horizontal type CVD apparatus. Further, the present invention can be applied not only to a batch CVD apparatus, but also to a sheet-feeding type CVD apparatus. Further in addition, the present invention can be applied not only to a low pressure type CVD apparatus, but also to a normal pressure type CVD apparatus. In addition, the present invention can also be applied to a wafer processing apparatus other than the CVD apparatus. Namely, the present invention can be applied to the wafer processing apparatus in general that applies a prescribed processing to wafers by using a chemical reaction in a reaction space. Moreover, the present invention can also be applied to the substrate processing apparatus other than the wafer processing apparatus. For example, the present invention can also be applied to a glass substrate processing apparatus that applies a prescribed processing to a glass substrate of a liquid crystal device.

A point is that by applying a prescribed processing to the substrate of a solid device, the present invention can be applied to the substrate processing apparatus in general, in which the reaction product is deposited on the inner wall of the processing gas output means such as a nozzle.

(5) It is a matter of course that the present invention can be variously modified and executed in the scope not departing from the gist of the invention.

Figure 1:
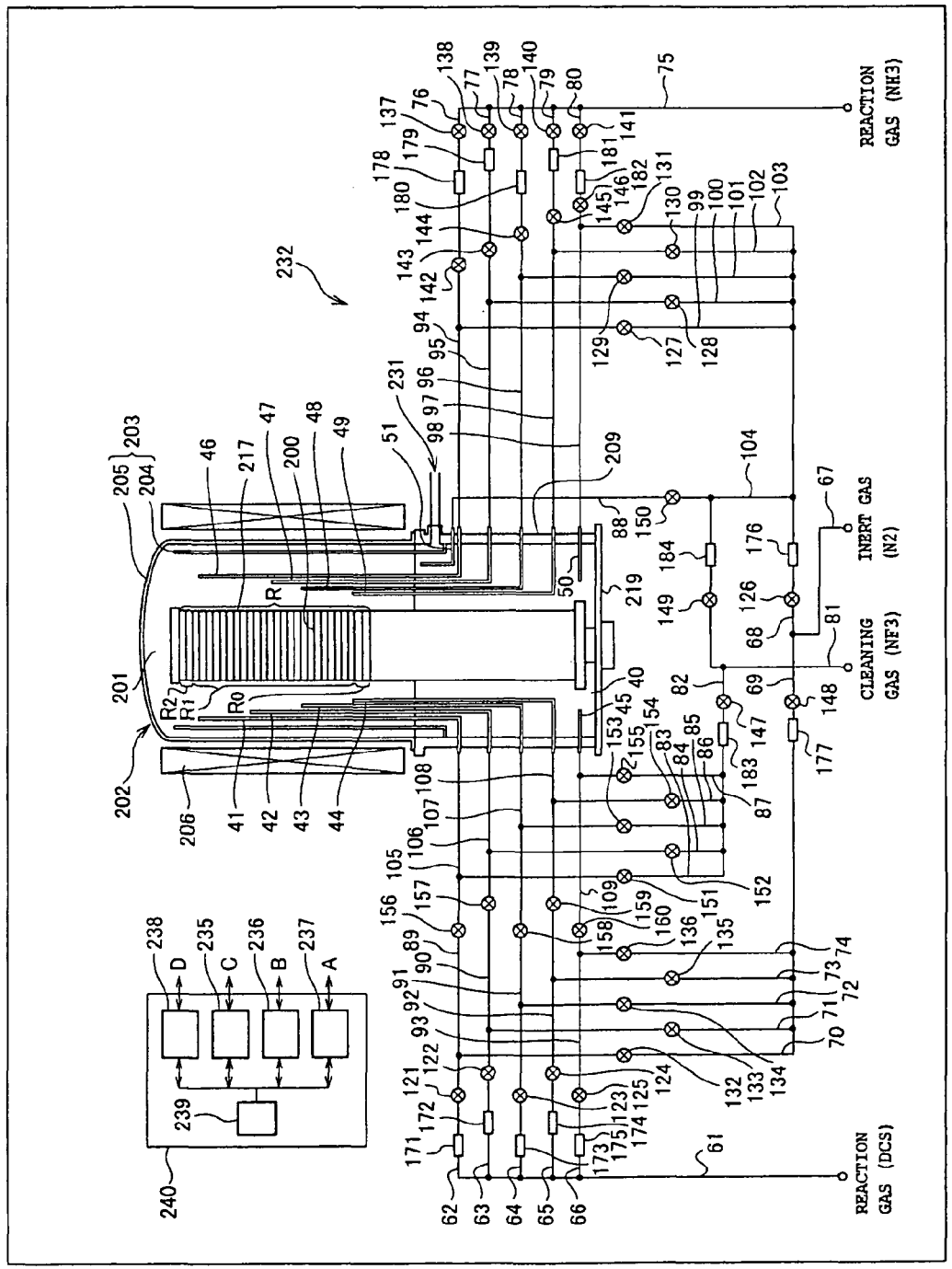
FIG. 1 is a block diagram showing a gas supply system of a processing furnace constituting a part of a substrate processing apparatus according to a first embodiment of the present invention.
Figure 2:
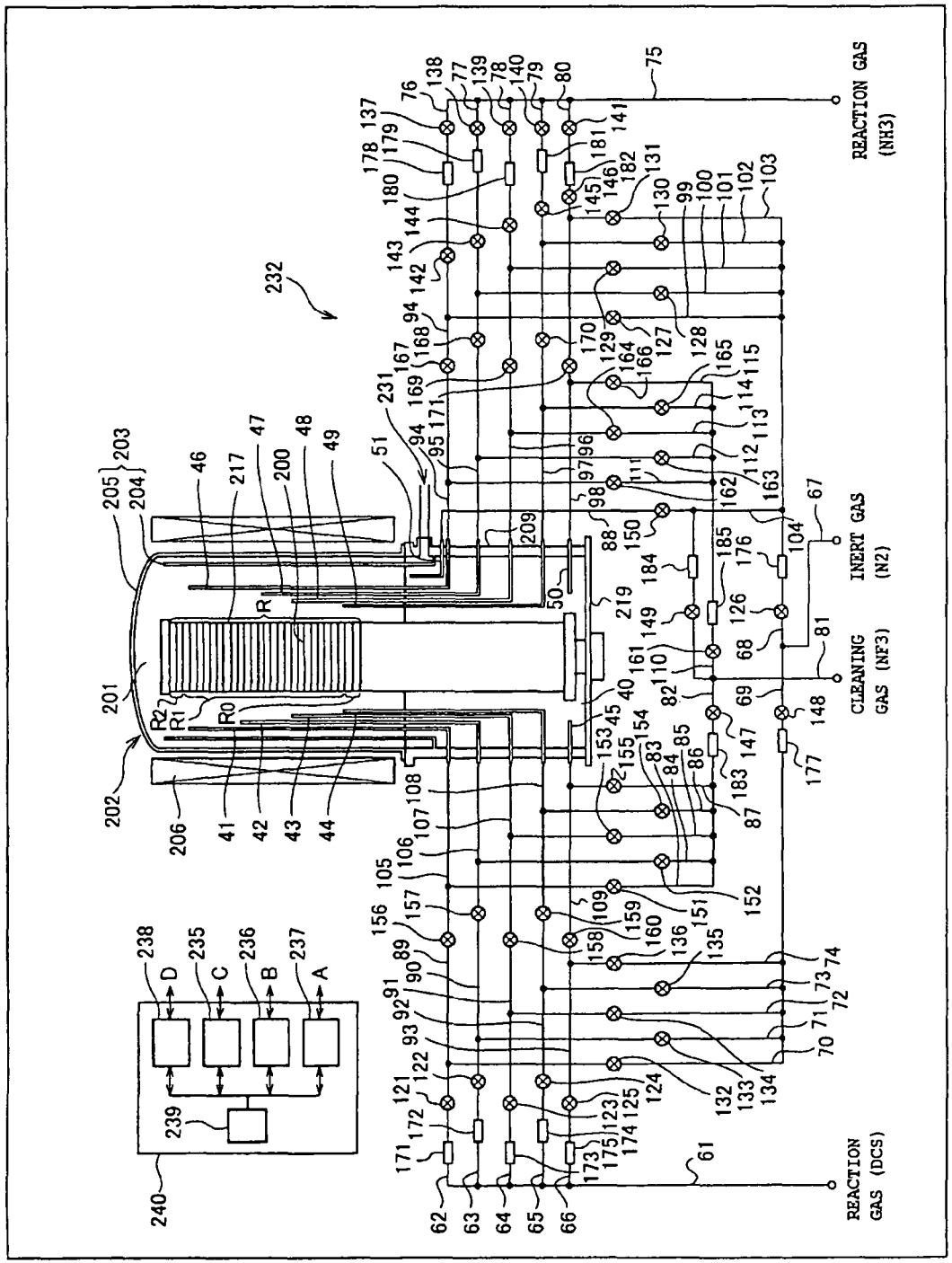
FIG. 2 is a block diagram showing the gas supply system of the processing furnace constituting a part of the substrate processing apparatus according to a second embodiment of the present invention.
Figure 3:
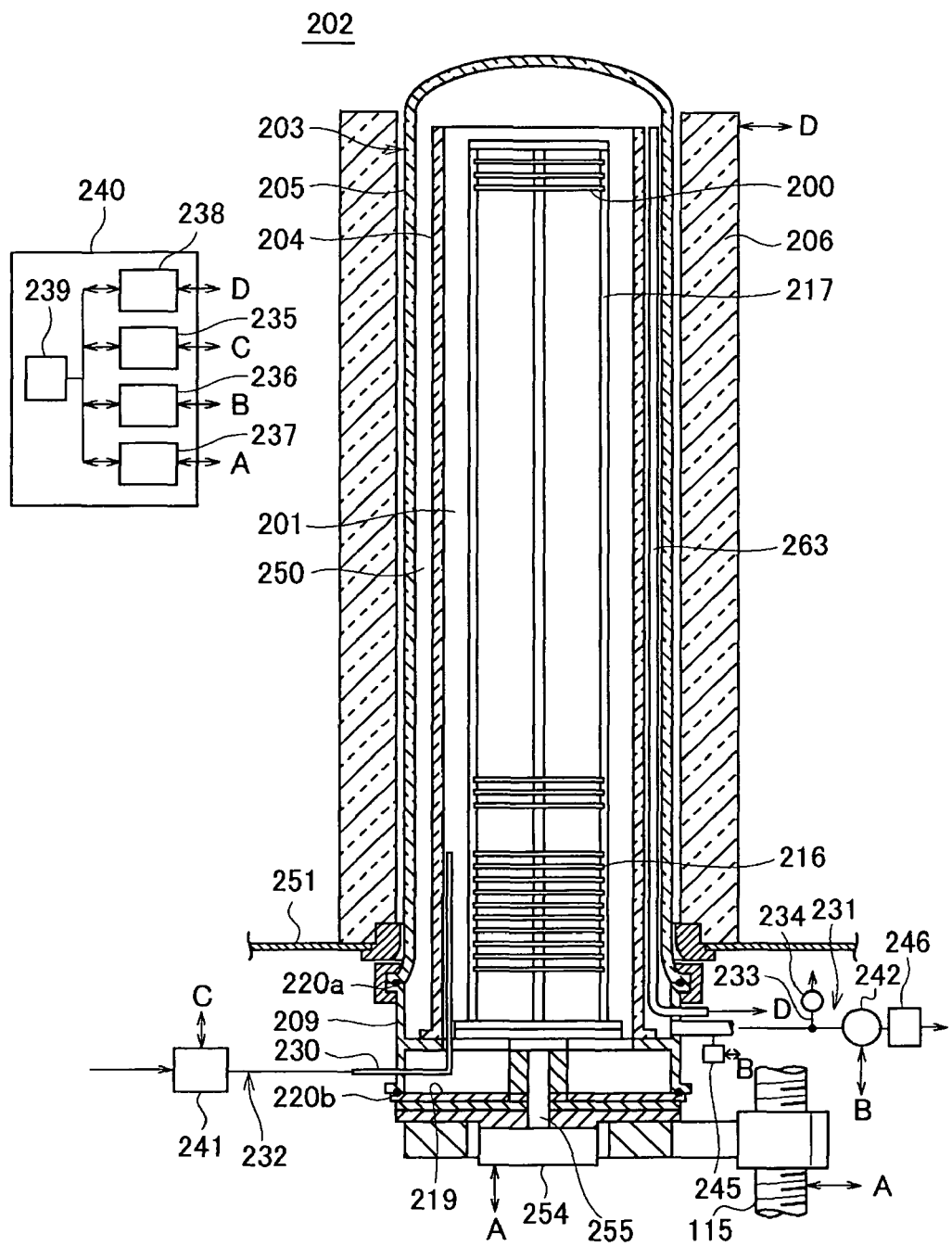
FIG. 3 is a schematic block diagram of the processing furnace constituting a part of the substrate processing apparatus according to the first embodiment of the present invention.
Figure 4:
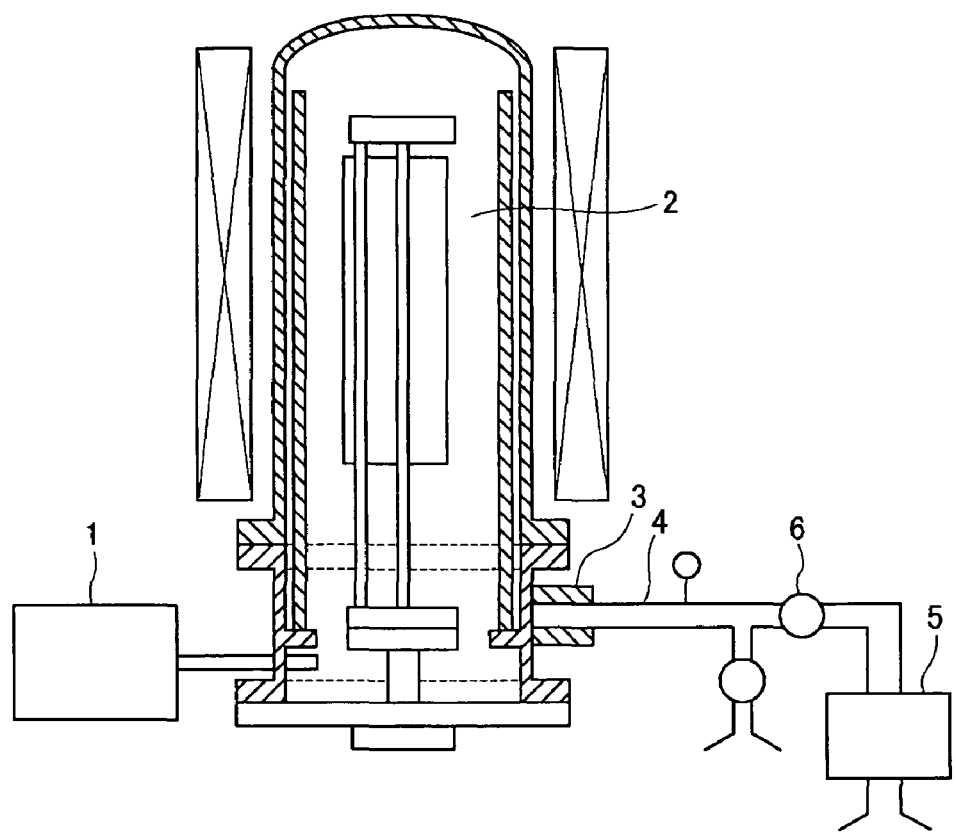
FIG. 4 is a schematic block diagram of a processing furnace constituting a part of the substrate processing apparatus of a conventional example.
Figure 5:
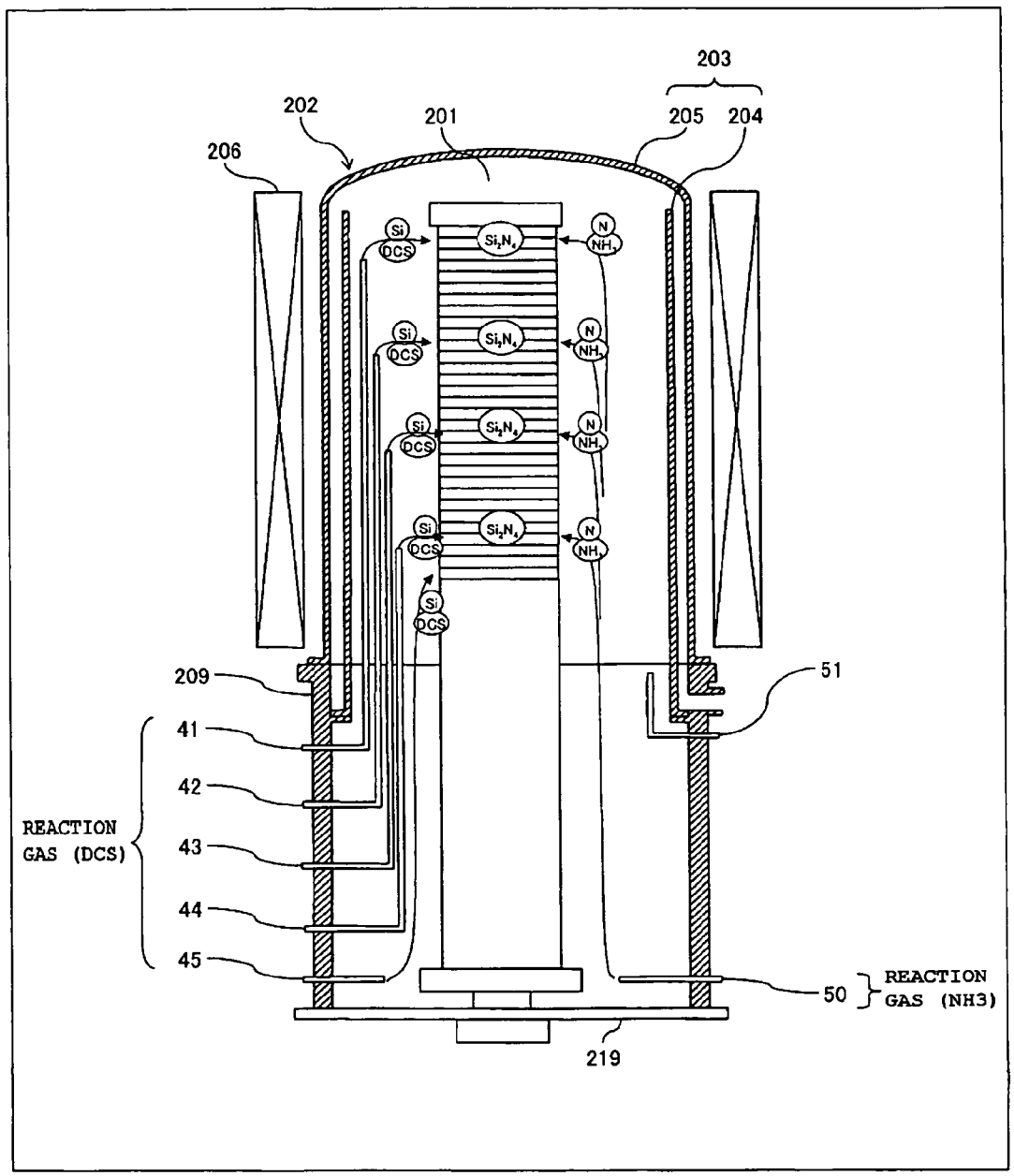
FIG. 5 is a block diagram showing a structure of the gas supply nozzle of the processing furnace constituting a part of the substrate processing apparatus according to a third embodiment of the present invention.
Figure 6:
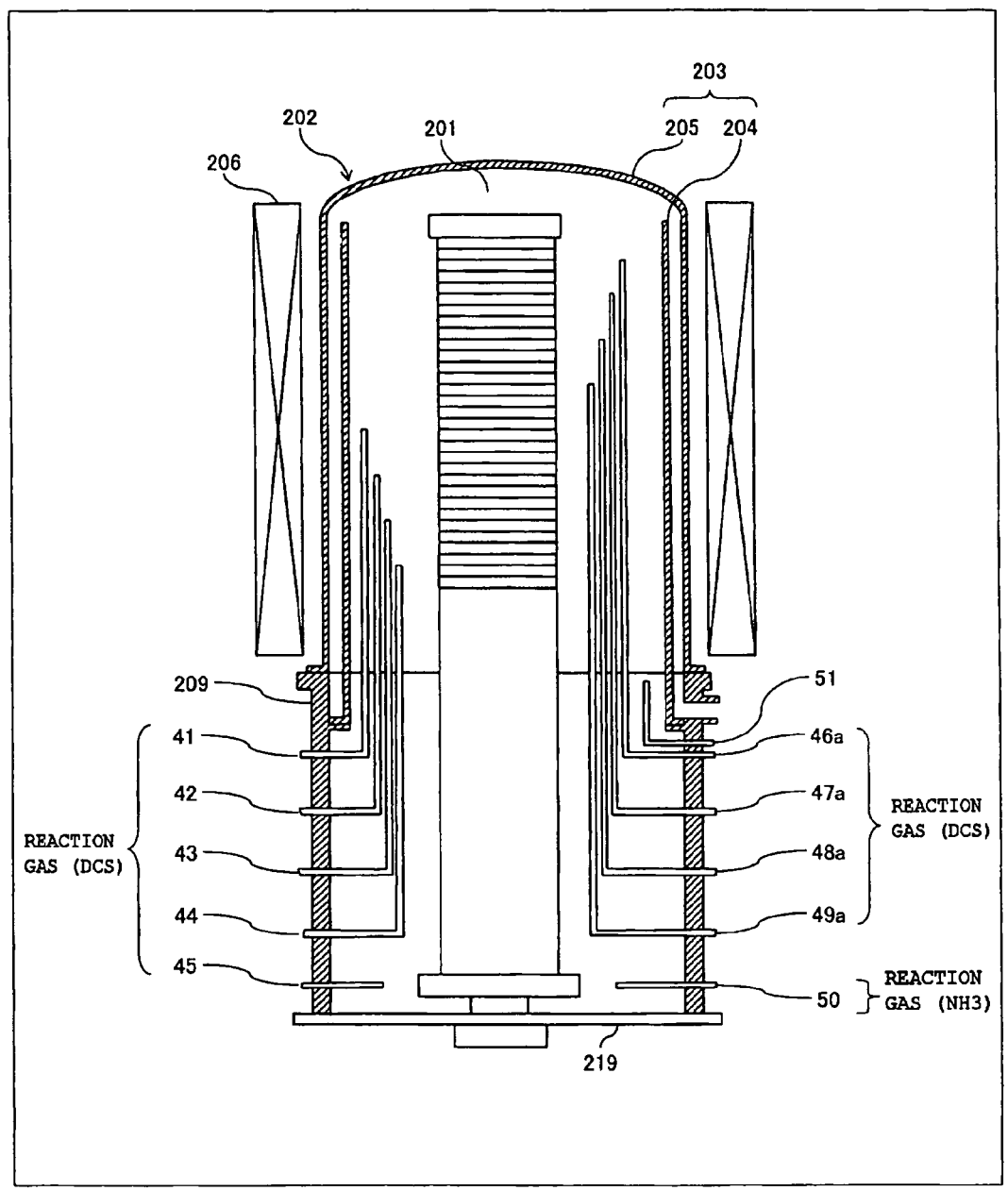
FIG. 6 is a block diagram showing the structure of the gas supply nozzle of the processing furnace constituting a part of the substrate processing apparatus according to a fourth embodiment of the present invention.
Figure 7:
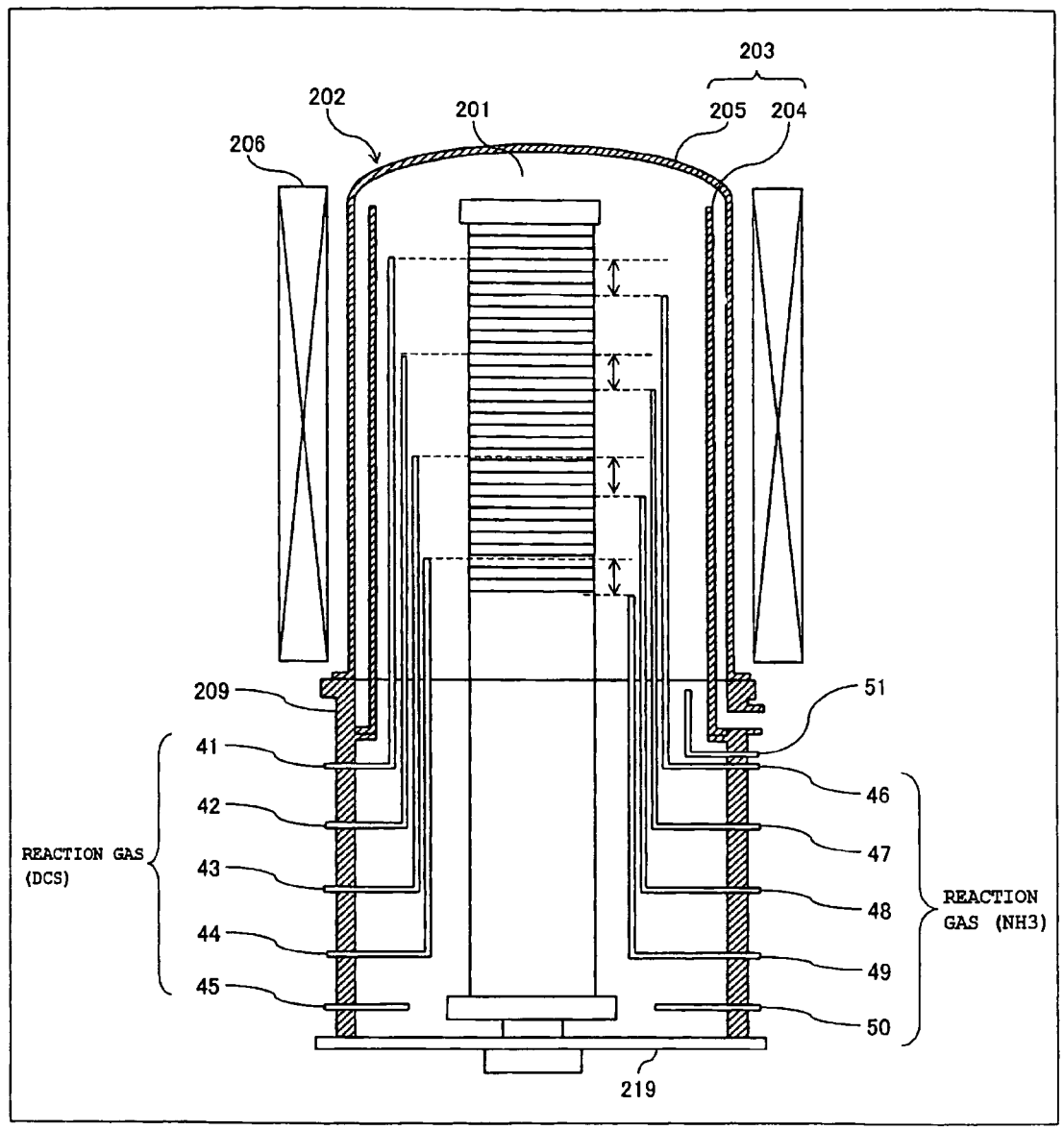
FIG. 7 is a block diagram showing the structure of the gas supply nozzle of the processing furnace constituting a part of the substrate processing apparatus according to a fifth embodiment of the present invention.
Figure 8:
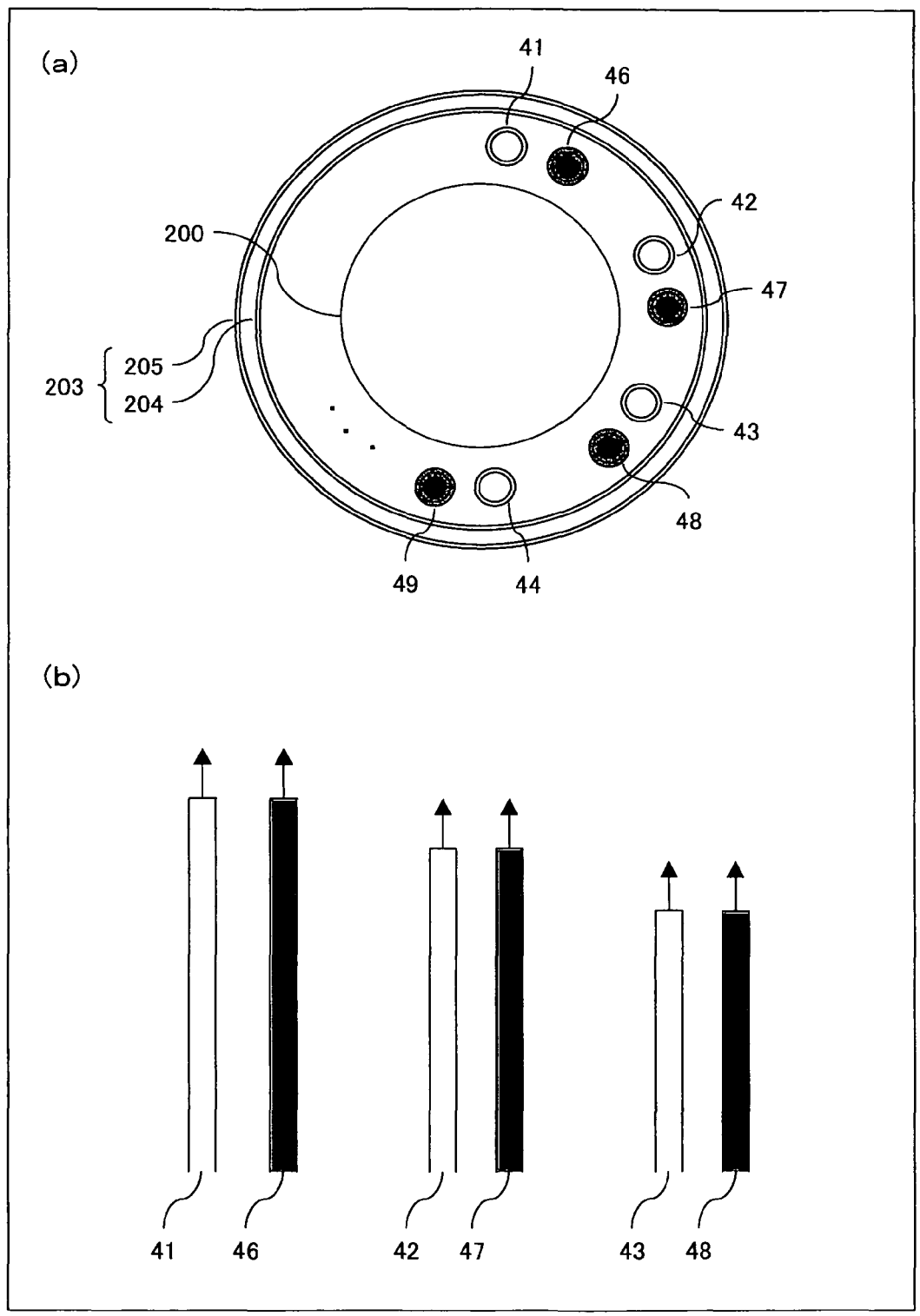
FIG. 8 is a block diagram showing the structure of the gas supply nozzle of the processing furnace constituting a part of the substrate processing apparatus according to a sixth embodiment, (a) shows a flat sectional view of the processing furnace, and (b) is a schematic view showing an arrangement of the gas supply nozzle in the processing furnace.
Figure 9:
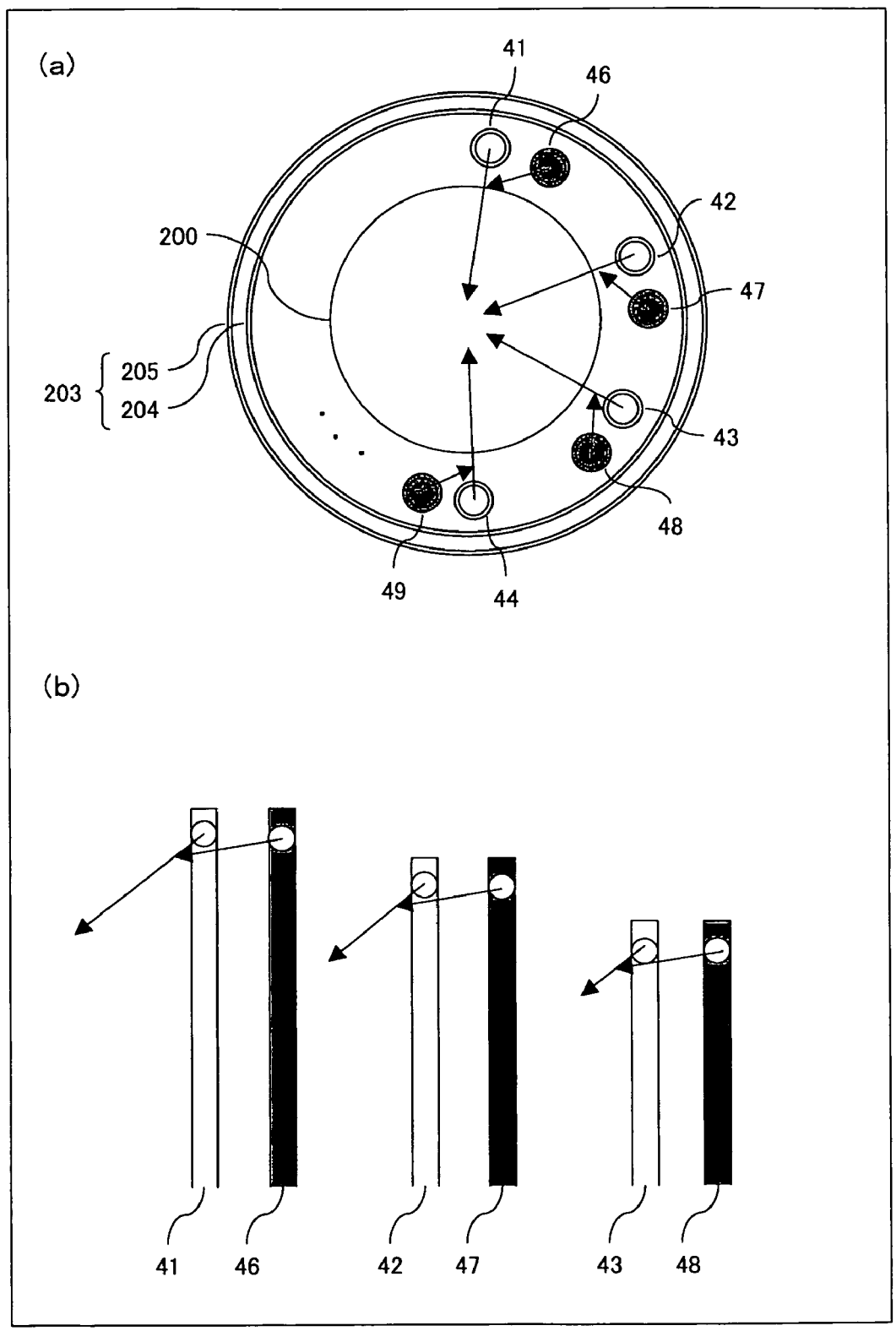
FIG. 9 is a block diagram showing the structure of the gas supply nozzle of the processing furnace constituting a part of the substrate processing apparatus according to a seventh embodiment, (a) shows a flat sectional view of the processing furnace, and (b) is a schematic view showing the arrangement of the gas supply nozzle in the processing furnace.
Figure 10:
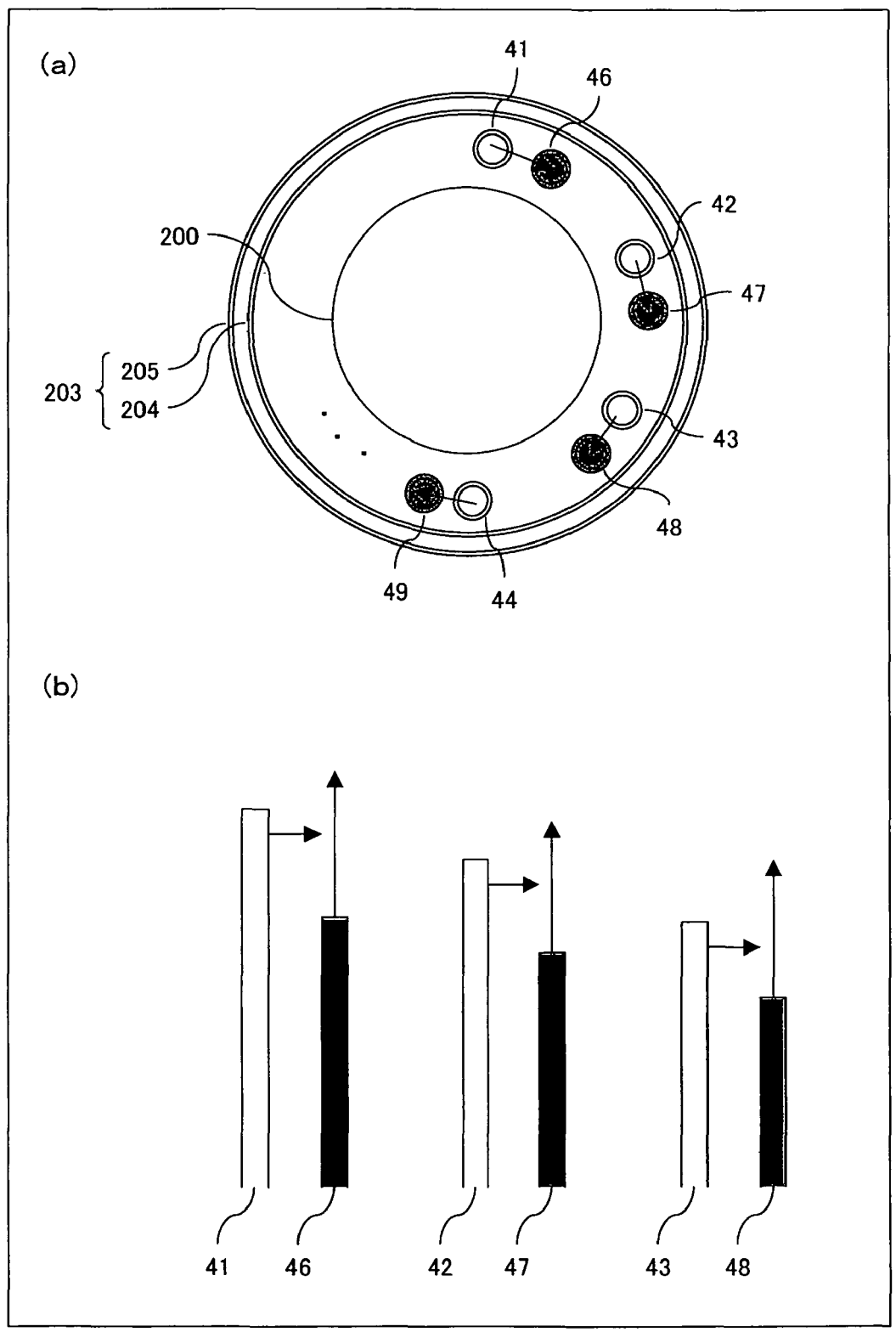
FIG. 10 is a block diagram showing the structure of the gas supply nozzle of the processing furnace constituting a part of the substrate processing apparatus according to an eighth embodiment, (a) shows a flat sectional view of the processing furnace, and (b) is a schematic view showing the arrangement of the gas supply nozzle in the processing furnace.
Figure 11:
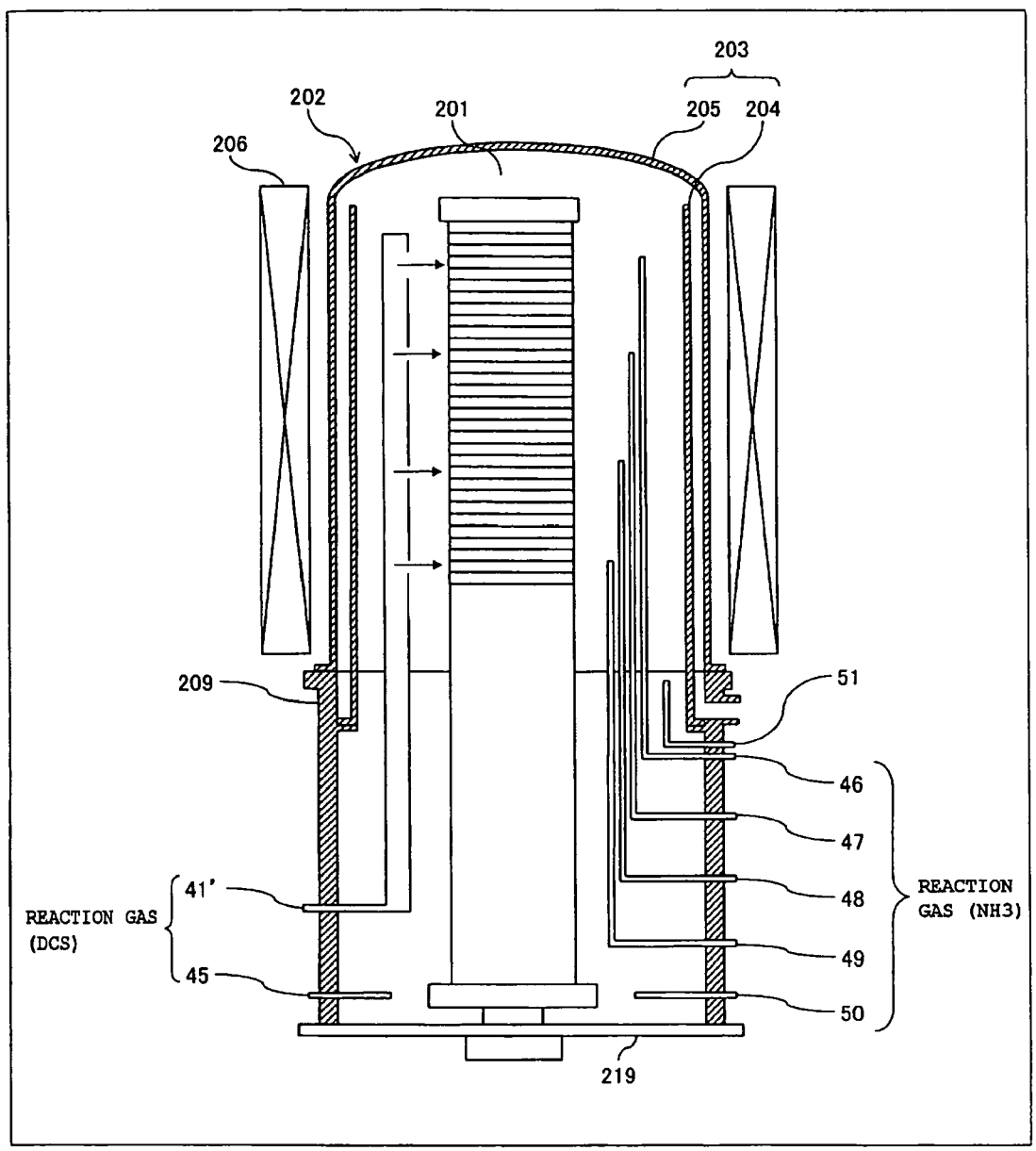
FIG. 11 is a block diagram showing the structure of the gas supply nozzle of the processing furnace constituting a part of the substrate processing apparatus according to a ninth embodiment of the present invention.
Figure 12:
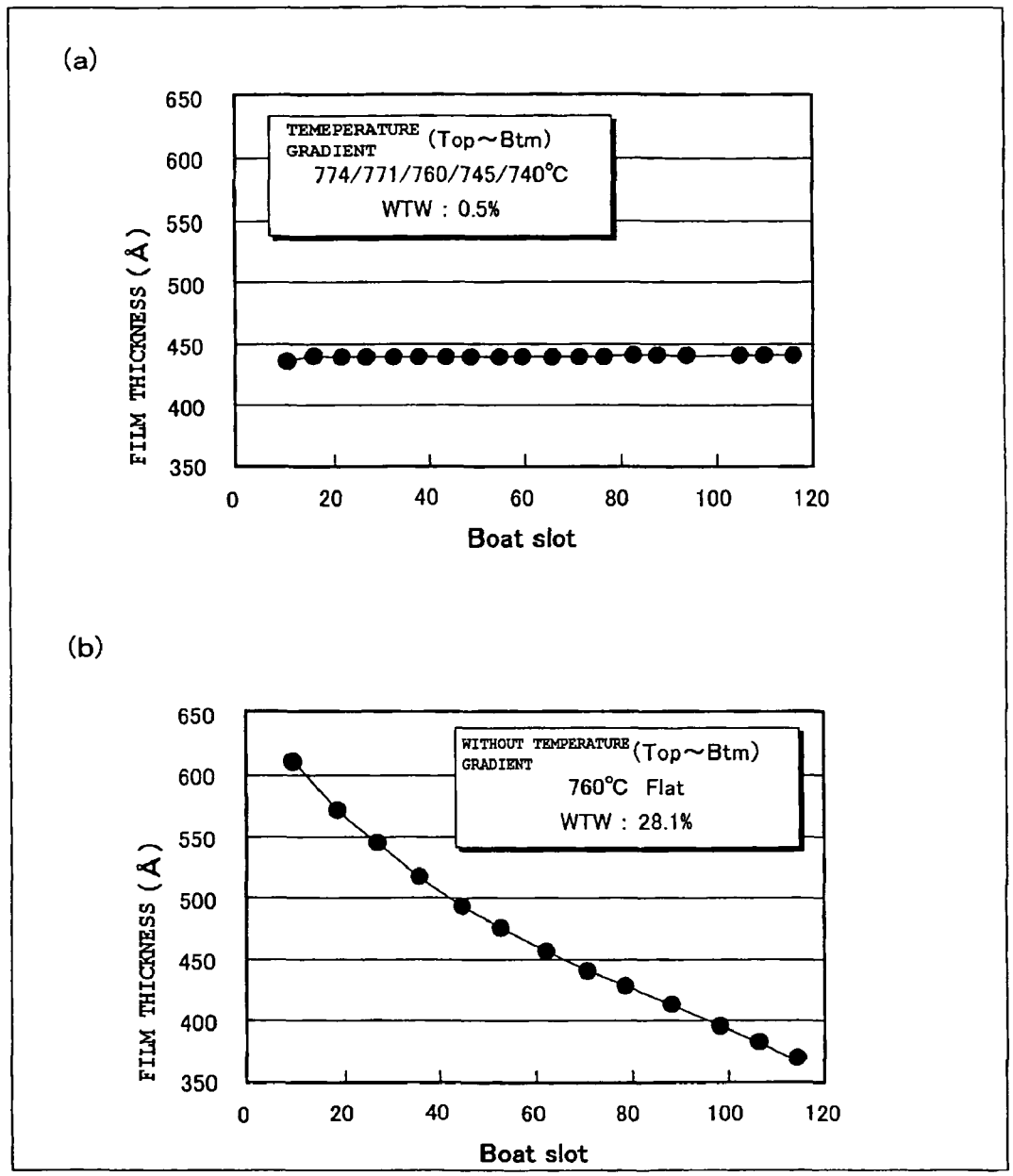
FIG. 12 is a graph showing a thickness distribution between wafers of a thin film formed by a method of not supplying a processing gas to a middle part, (a) shows a film thickness distribution when a temperature gradient is provided in a plurality of wafers, and (b) shows a film thickness distribution when the temperature gradient is not provided.
Figure 13:
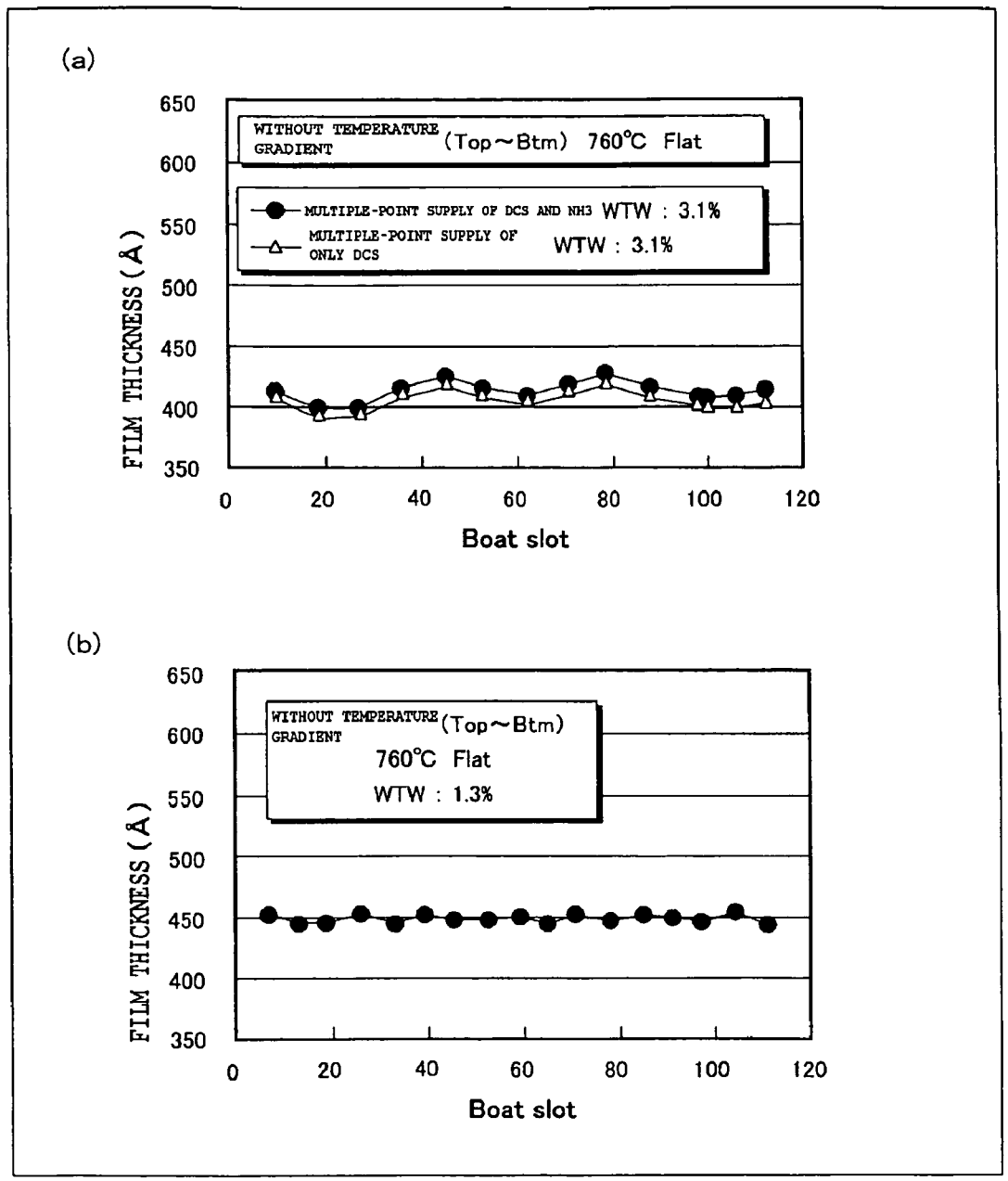
FIG. 13 is a graph showing the film thickness distribution between wafers of the thin film formed by a method of supplying the processing gas to the middle part, (a) shows a film thickness distribution when a DCS gas and an $NH_3$ gas are supplied to the middle part, and only the DCS gas is supplied to the middle part, and (b) shows the film thickness distribution when a supply part of the DCS gas is further increased.
Figure 14:
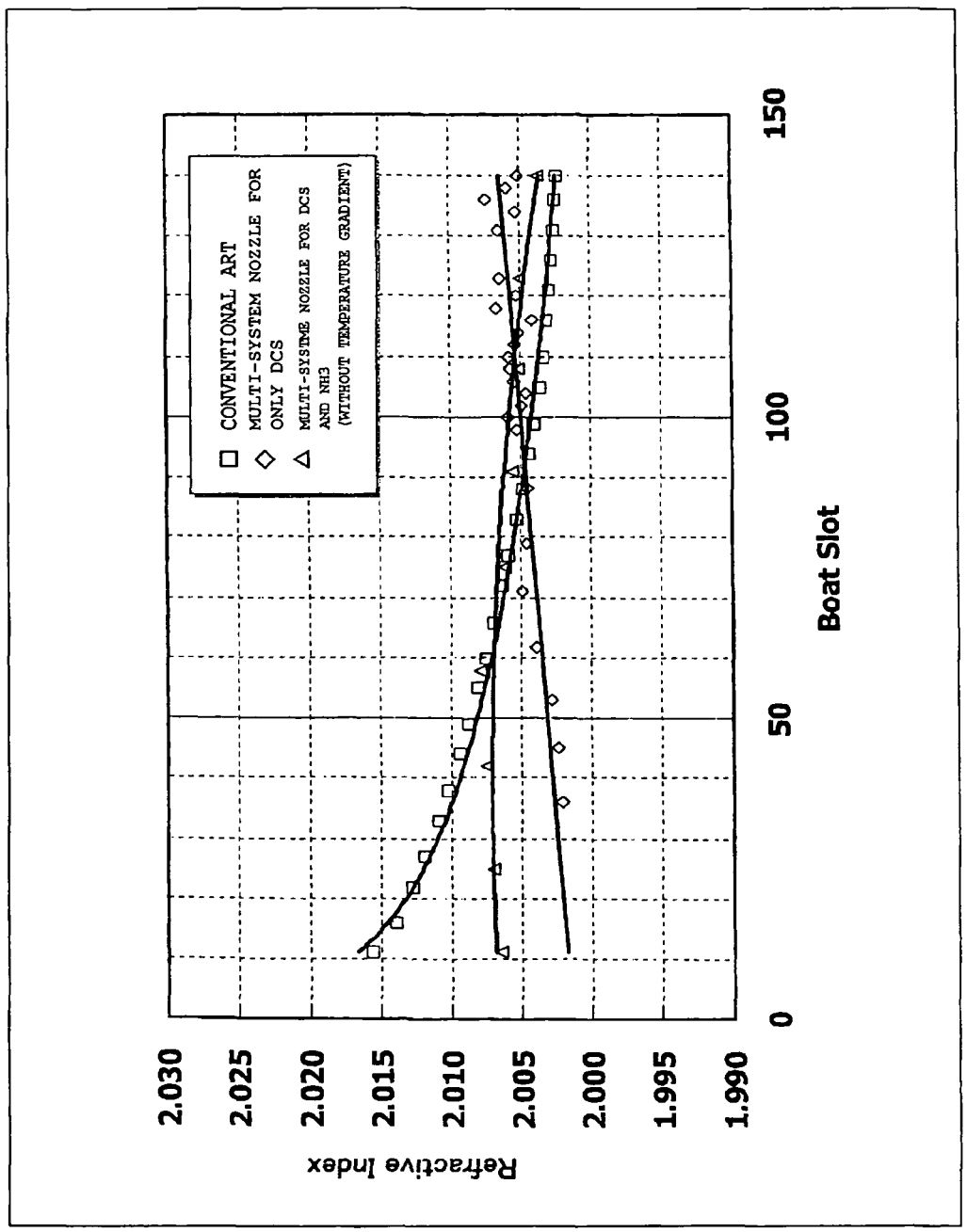
FIG. 14 is a graph showing a distribution between wafers of a refractive index of the thin film when the thin film is formed by the method of not supplying the processing gas to the middle part, and a distribution between wafers of the refractive index of the thin film when the thin film is not formed by the method of supplying the processing gas to the middle part.
Figure 15:
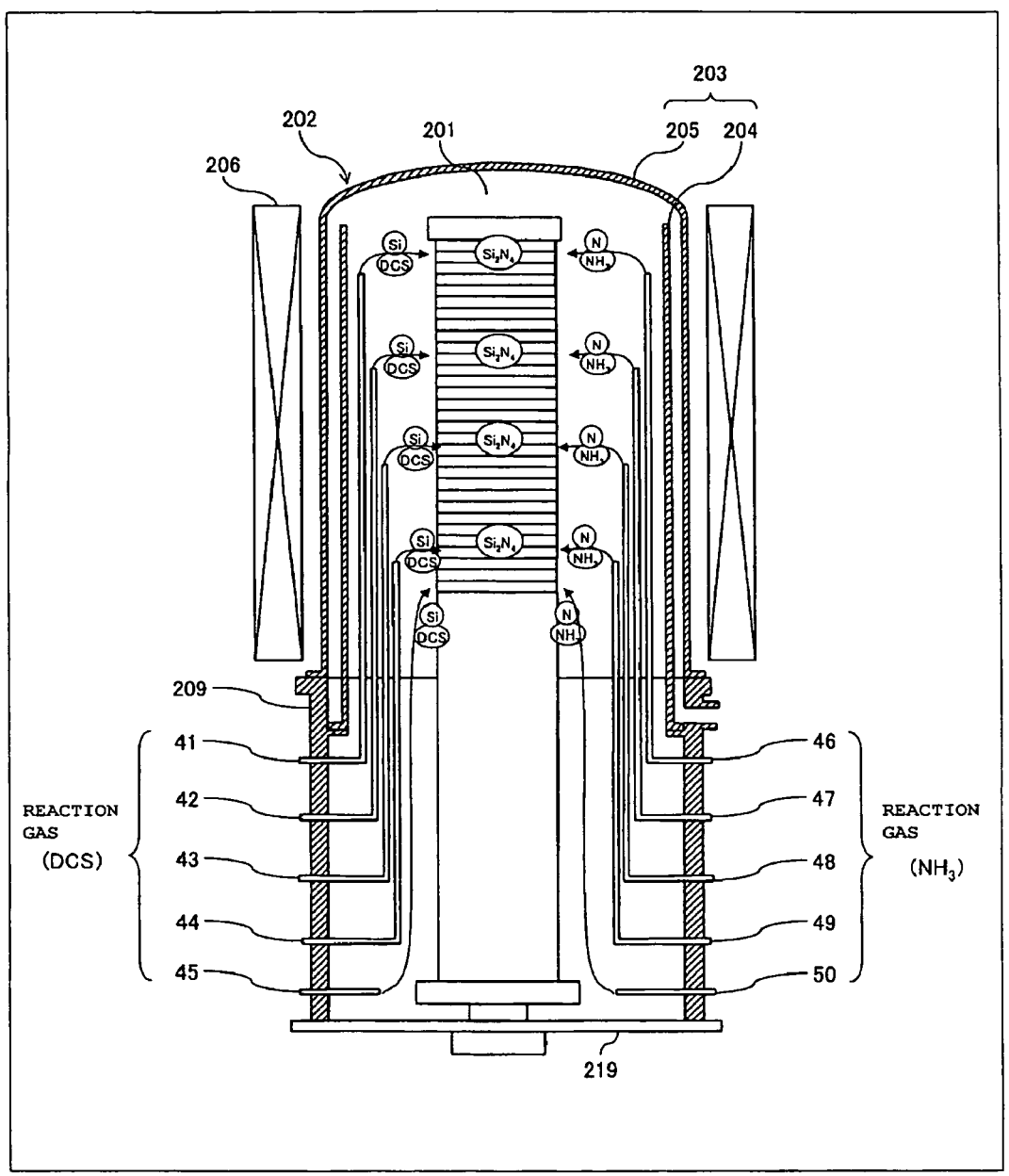
FIG. 15 is a schematic view showing a state that gases supplied from the nozzles of approximately the same heights are reacted with each other, to form an amorphous material, and the thin film is formed on the wafer.
Figure 16:
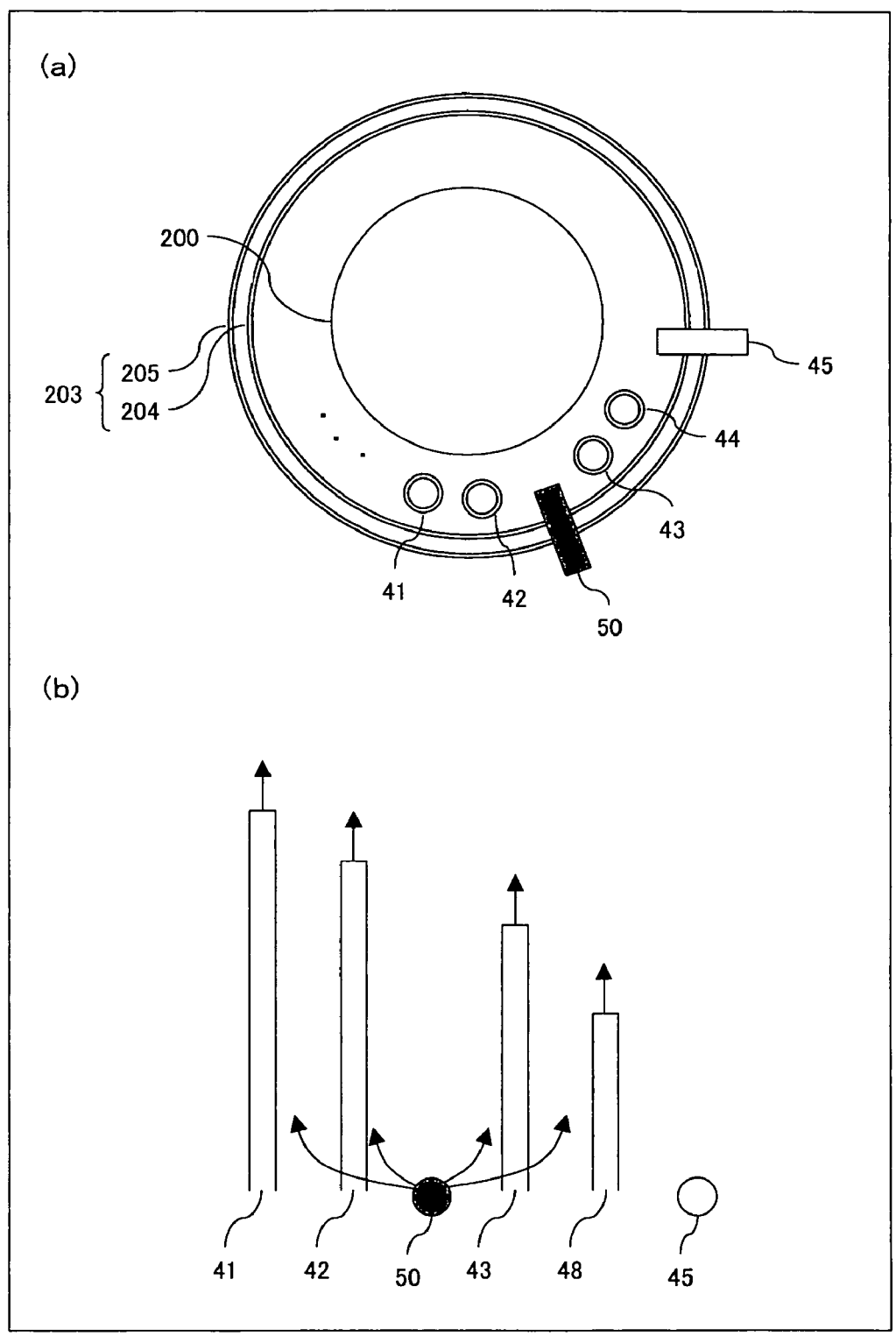
FIG. 16 is a block diagram showing the structure of the gas supply nozzle of the processing furnace constituting a part of the substrate processing apparatus according to a thirteenth embodiment of the present invention.

DESCRIPTION OF SIGNS AND NUMERALS 41 to 44 Nozzles (second gas supply part)
45 Nozzle (first gas supply part)
46 to 49 Nozzles (forth gas supply parts)
50 Nozzle (third gas supply part)
178 to 182 Mass flow controller (gas flow controller)
171 to 175 Mass flow controller (gas flow controller)
200 Wafer (substrate)
201 Processing chamber
202 Processing furnace (constituting a part of a substrate processing apparatus)
217 Boat (holding tool)
231 Exhaust system (exhaust part)
232 Gas supply system
$R_1$ Product wafer/monitor wafer arrangement region (region where substrates are arranged)

The invention claimed is:

1. A manufacturing method of a semiconductor device comprising:
loading a plurality of substrates into a processing chamber;
supplying a first processing gas containing at least one element out of a plurality of elements constituting a thin film formed on a main surface of the substrate and capable of depositing a film by itself, to an upper stream side of a gas flow outside of a region where the plurality of substrates loaded into the processing chamber are arranged, also supplying the first processing gas to a middle part of the gas flow within the region where the plurality of substrates loaded into the processing chamber are arranged, by a multi-system nozzle;
supplying a second processing gas containing at least one element out of the plurality of elements and not capable of depositing the film by itself, to the upper stream side of the gas flow outside of the region where the plurality of substrates loaded into the processing chamber are arranged, by a nozzle provided on the upper stream side of the gas flow, which is a different nozzle from the multi-system nozzle, and forming an amorphous material by allowing the first processing gas and the second processing gas to react with each other in the processing chamber, and forming the thin film on the main surfaces of the plurality of substrates; and
unloading the substrate after forming the thin film from the processing chamber.

2. The manufacturing method of the semiconductor device according to claim 1, wherein supply of the first processing gas to the middle part of the gas flow includes the supply of the first processing to a plurality of middle parts provided along the gas flow at mutually different positions, in a region where the plurality of substrates loaded into the processing chamber are arranged.

3. The manufacturing method of the semiconductor device according to claim 2, wherein in the supply of the first processing gas to the middle part of the gas flow, the first processing gas is supplied via a plurality of nozzles with mutually different lengths, and the plurality of nozzles with different lengths allow the gas to flow from an upper stream side of the gas flow outside of the region where the plurality of substrates loaded into the processing chamber are arranged, to a plurality of middle parts at mutually different positions, provided along the gas flow in a region where the plurality of substrates loaded into the processing chamber are arranged.

4. The manufacturing method of the semiconductor device according to claim 2, further including the supply of the second processing gas to the middle part of the gas flow in the region where the plurality of substrates loaded into the processing chamber are arranged, and the supply of the second processing gas to the middle part of the gas flow includes the supply of the second processing gas to a plurality of middle parts provided along the gas flow at mutually different positions, in the region where the plurality of substrates loaded into the processing chamber are arranged.

5. The manufacturing method of the semiconductor device according to claim 4, wherein in the supply of the second processing gas to the middle part of the gas flow, the second processing gas is supplied via a plurality of nozzles with mutually different lengths, and the plurality of nozzles with different lengths allow the gas to flow to a plurality of middle parts, at mutually different positions, provided along the gas flow in a region where the plurality of substrates loaded into the processing chamber are arranged, from an upper stream side of the gas flow outside of the region where the plurality of substrates loaded into the processing chamber are arranged.

6. The manufacturing method of the semiconductor device according to claim 4, wherein in the supply of the first processing gas to the middle part of the gas flow, the first processing gas is supplied via first plurality of nozzles with mutually different lengths, and in the supply of the second processing gas to the middle part of the gas flow, the second processing gas is supplied via second plurality of nozzles with mutually different lengths, with nozzles of the first plurality of nozzles having substantially same lengths being arranged so as to be adjacent to each other.

7. The manufacturing method of the semiconductor device according to claim 1, further including the supply of the second processing gas to the middle part of the gas flow in the region where the plurality of substrates loaded into the processing chamber are arranged.

8. The manufacturing method of the semiconductor device according to claim 7, wherein the supply of the second processing gas to the middle part of the gas flow includes the supply of the second processing gas to the middle part of the gas flow provided at substantially the same position as the middle part to which the first processing gas is supplied.

9. The manufacturing method of the semiconductor device according to claim 7, wherein the supply of the second processing gas to the middle part of the gas flow includes the supply of the second processing gas to the middle part of the gas flow provided on an upper stream side of the gas flow beyond the middle part, in adjacent to the middle part to which the first processing gas is supplied.

10. The manufacturing method of the semiconductor device according to claim 7, wherein in the step of forming the thin film, a temperature of main surfaces of the plurality of substrates loaded into the processing chamber is increased to a temperature at which at least both of the first processing gas and the second processing gas are thermally decomposed, and the temperature of the main surface between the plurality of substrates are maintained to be substantially uniform over an overall region where the plurality of substrates are arranged.

11. The manufacturing method of the semiconductor device according to claim 7, wherein in the supply of the second processing gas to the upper stream side of the gas flow, the second processing gas is supplied from a third gas supply part into the processing chamber while controlling the gas flow amount, and in the supply of the second processing gas to the middle part of the gas flow, the first processing gas is supplied into the processing chamber from a fourth gas supply part, wile controlling a gas flow amount independently of a control of a gas flow amount in the third gas supply part.

12. The manufacturing method of the semiconductor device according to claim 7, wherein in the supply of the second processing gas to the middle part, the second processing gas is supplied via a nozzle, and the nozzle allows the gas to flow to the middle part in a region where the plurality of substrates loaded into the processing chamber are arranged, from an upper stream side of the gas flow outside of the region where the plurality of substrates loaded into the processing chamber are arranged.

13. The manufacturing method of the semiconductor device according to claim 7, wherein in the supply of the second processing gas to the middle part of the gas flow, the second processing gas is supplied to join the gas flow of the first processing gas in the supply of the first processing gas to the middle part of the gas flow.

14. The manufacturing method of the semiconductor device according to claim 13, wherein in the supply of the first processing gas to the middle part of the gas flow, the first processing gas is supplied toward a center of main surfaces of the plurality of substrates loaded into the processing chamber.

15. The manufacturing method of the semiconductor device according to claim 7, wherein the step of forming the thin film includes the step of causing the first processing gas supplied to the upper stream side of the gas flow outside of the region where the plurality of substrates loaded into the processing chamber are arranged, and the second processing gas supplied to the upper stream side of the gas flow, to react with each other to form an amorphous material; and the step of causing the first processing gas supplied to the middle part and the second processing gas supplied to the middle part, to react with each other to form the amorphous material, and forming the thin film on the plurality of substrates on the lower stream side beyond the middle part to which the first processing gas is supplied.

16. The manufacturing method of the semiconductor device according to claim 7, wherein a supply amount of a gas supplied to a middle part of a gas flow of the first processing gas to a supply amount of a gas supplied to the upper stream side of a gas flow of the first processing gas, and a supply amount of a gas supplied to the middle part of the gas flow of the second processing gas to a supply amount of a gas supplied to the upper stream side of the gas flow of the second processing gas, are substantially same.

17. The manufacturing method of the semiconductor device according to claim 1, wherein in the step of forming the thin film, a temperature of main surfaces of the plurality of substrates loaded into the processing chamber is increased to a temperature at which at least both of the first processing gas and the second processing gas are thermally decomposed, and the temperature of the main surface between the plurality of substrates is maintained to be substantially uniform over an overall region where the plurality of substrates are arranged.

18. The manufacturing method of the semiconductor device according to claim 1, wherein in the supply of the first processing gas to an upper stream side of the gas flow, the first processing gas is supplied into the processing chamber while controlling a gas flow rate, and in the supply of the first processing gas to the middle part of the gas flow, the first processing gas is supplied from a second gas supply part into the processing chamber while controlling a gas flow amount independently of a control of a gas flow amount in the first gas supply part.

19. The manufacturing method of the semiconductor device according to claim 1, wherein in the step of forming the thin film, the plurality of substrates loaded into the processing chamber are arranged in a horizontal posture, with spaced apart from each other in multiple stages.

20. The manufacturing method of the semiconductor device according to claim 1, wherein the first processing gas is a gas containing a silicon element, and the second processing gas is a gas containing a nitrogen element or an oxygen element, and the thin film is a thin film formed of an amorphous material containing the silicon element and the nitrogen element or the thin film formed of the amorphous material containing the silicon element and the oxygen element.

21. The manufacturing method of the semiconductor device according to claim 20, wherein the first processing gas is a gas of any one of TCS, HCD, and BTBAS, and the second processing gas is an NH3 gas.

22. The manufacturing method of the semiconductor device according to claim 1, wherein the first processing gas is a gas containing a chlorine element, and the second processing gas is a gas containing a nitrogen element or an oxygen element.

23. The manufacturing method of the semiconductor device according to claim 1, wherein in the supply of the first processing gas to the middle part of the gas flow, the first processing gas is supplied via a nozzle, and the nozzle allows the gas to flow to the middle part in a region where the plurality of substrates loaded into the processing chamber are arranged, from an upper stream side of the gas flow outside of the region where the plurality of substrates loaded into the processing chamber are arranged.

24. The manufacturing method of the semiconductor device according to claim 1, wherein the step of forming the thin film includes the step of causing the first processing gas and the second processing gas supplied to an upper stream side of the gas flow outside of the region where the plurality of substrates are arranged, to react with each other to form an amorphous material, and forming the thin film on the main surfaces of the plurality of substrates; and the step of causing the first processing gas and the second processing gas supplied to the middle part in a region where the plurality of substrates loaded into the processing chamber are arranged, to react with each other, to form an amorphous material, and forming the thin film on the main surfaces of the plurality of substrates on a lower stream side beyond the middle part to which the first processing gas is supplied.

25. The manufacturing method of the semiconductor device according to claim 1, wherein a supply amount of the second processing gas to the upper stream side is larger than a total amount of a supply amount of the first processing gas supplied to the upper stream side of the gas flow and a supply amount of the first processing gas supplied to the middle part of the gas flow.

26. A manufacturing method of a semiconductor device comprising:

loading a plurality of substrates into a processing chamber; and supplying ammonia-based gas or nitrogen oxide gas to an upper stream side of a gas flow outside of a region where the plurality of substrates loaded into the processing chamber are arranged, by a nozzle provided on the upper stream side of the gas flow, while supplying a gas containing silane-based gas to a middle part on an upper stream side of the gas flow outside of the region where the plurality of substrates loaded into the processing chamber are arranged and a middle part in a region where the plurality of substrates loaded into the processing chamber are arranged by a multi-system nozzle, which is different from the aforementioned nozzle, then causing the gas containing the silne-based gas and the ammonia-based gas or the nitrogen oxide gas to react with one another, thereby forming a thin film on main surfaces of the plurality of substrates.

* * * * *